US012228612B1

(12) United States Patent
Hack

(10) Patent No.: US 12,228,612 B1
(45) Date of Patent: Feb. 18, 2025

(54) MECHANISM AND METHOD OF PROTECTION, MONITORING AND CONTROL OF SWITCHGEAR USING ROGOWSKI COILS AND CAPACITIVE VOLTAGE DIVIDER-LIKE DEVICES SURROUNDING THE BOTTLES WITH ICS FOR CONVERTING ANALOG TO DIGITAL SIGNALS AND LOOKUP TABLE ON THE IC

(71) Applicant: Bruce Hack, Yonkers, NY (US)

(72) Inventor: Bruce Hack, Yonkers, NY (US)

( * ) Notice: Subject to any disclaimer, the term of this patent is extended or adjusted under 35 U.S.C. 154(b) by 0 days.

(21) Appl. No.: 18/938,463

(22) Filed: Nov. 6, 2024

Related U.S. Application Data

(63) Continuation-in-part of application No. 18/792,713, filed on Aug. 2, 2024, now Pat. No. 12,158,502, which is a continuation of application No. 18/196,743, filed on May 12, 2023, now Pat. No. 12,085,614.

(51) Int. Cl.
G01R 31/327 (2006.01)
G01R 15/06 (2006.01)
G01R 15/18 (2006.01)
H02H 7/22 (2006.01)

(52) U.S. Cl.
CPC ......... G01R 31/3271 (2013.01); G01R 15/06 (2013.01); G01R 15/181 (2013.01); H02H 7/222 (2013.01)

(58) Field of Classification Search
CPC .. G01R 31/3271; G01R 15/06; G01R 15/181; H02H 7/222
USPC .......................................... 324/415
See application file for complete search history.

(56) References Cited

U.S. PATENT DOCUMENTS

| | | | | |
|---|---|---|---|---|
| 5,402,438 A * | 3/1995 | Tanuma | ................ | H01S 3/0804 372/71 |
| 5,432,438 A * | 7/1995 | Baumgartner | ....... | G01R 15/181 340/657 |
| 6,295,190 B1 * | 9/2001 | Rinaldi | ............. | G01R 31/3274 361/96 |
| 2023/0132216 A1 | 4/2023 | Meisinger et al. | | |

* cited by examiner

Primary Examiner — Tung X Nguyen
Assistant Examiner — Robert P Alejnikov, Jr.
(74) Attorney, Agent, or Firm — Andrew S. Langsam, Esq.

(57) ABSTRACT

A device for protecting, controlling, and monitoring electrical medium range switchgear or other electrical devices comprising use of a Rogowski coil embedded in the bottle of a switchgear and surrounding the Mains flow of current carrying voltage, a capacitive or similar voltage-like divider, also surrounding the Mains and extending around the bottle, and providing analog signals from those devices to an integrated circuit for conversion to digital signals after possible adjustment by look up tables stored on the integrated circuit, and then transmitting as output the digital signals to a data accumulator where the same are optionally time stamped and compared to one another, to a standard or to themselves at a different time.

14 Claims, 9 Drawing Sheets

MECHANISM AND METHOD OF PROTECTION, MONITORING AND CONTROL OF SWITCHGEAR USING ROGOWSKI COILS AND CAPACITIVE VOLTAGE DIVIDER-LIKE DEVICES SURROUNDING THE BOTTLES WITH ICS FOR CONVERTING ANALOG TO DIGITAL SIGNALS AND LOOKUP TABLE ON THE IC

Related Applications: This application claims priority on U.S. application Ser. No. 18/792,713 file Aug. 2, 2024; which claims priority upon U.S. application Ser. No. 18/196,743 filed May 12, 2023, now U.S. Pat. No. 12,085,614, issued Sep. 10, 2024, by the same Inventor and incorporates by reference the disclosures therein including the specification, claims, Abstract and Drawings. In addition, the present application claims priority upon PCT Application PCT/US2024/027,624 which was filed May 3, 2024—the specification, claims, Abstract and Drawings thereof also being incorporated by reference herein.

Background of the Invention and Description of the Prior Art

Medium voltage switchgear transmits and protects electrical power that is generally in the range of 1,001 to 40,000 volts and between about 100 to 5,000 amps. None of these ratings or values are of the kind that can be touched by human hands without severe injury or more likely resulting in death. Additionally, prior to the present invention, none of these devices can be directly monitored, protected, or metered. There is no "Direct" sensing that lets one know what amount of current and/or voltage is actually going through the switchgear/circuit breaker. Heretofore, and currently indirect, proportional measurements of the current and voltage in medium switchgear is provided in analog fashion, using voluminous and costly transformational devices. The present invention takes analog signals from newer low powered sensing devices, immediately converts the same via an integrated circuit to digital signals and then adds a time stamping so as to be able to compare this instantaneous time stamped value to other time stamped samples of the same sensor(s) or control values and/or to other sensed signal locations at both the same and differing temporal instances. A less expensive, less bulky and less costly system for controlling, monitoring and protecting electrical equipment in the nature of switchgear is the desired end result.

Prior to the present invention, there was only "indirect" sensing that lets us know if all is OK with the circuit's voltage, amperage (and other characteristics) and if the circuit breaker or switchgear should stay closed (allowing current to flow) or if there is now a situation that is NOT OK and the circuit breaker should immediately trip open due to improper voltage and/or amperage suggesting an impending calamitous situation. These prior art devices are voluminous, heavy, expensive, and provide information in analog form. They are referred to as Current Transformers. It would thus be highly desirous to provide a lightweight, relatively inexpensive, and ultimately digital signal providing device for use with medium voltage switchgear. And, if the device so provided were "self-monitoring" then another significant advantage would be provided so that the owner/maintaining individual(s) of the switchgear could know whether there is a fault, a ground fault, a short circuit or if the sensor/gauge itself is in a failure mode and needs attention or replacement.

The long applied state of the art in the electrical switchgear industry is to use current transformers (CTs), and voltage transformers (known interchangeably as VT's "Voltage" Transformers or PT's "Potential" Transformers) and connecting them to and around the Main's Power conductors in switchgear. Mains Power refers, in this context, to alternating current providing electric power that is delivered to and through the electric grid. These transforming devices (CTs, & VTs or PTs) can sense the condition of the Mains Power conductors and send out a much lower, yet proportional analog signal of the Main's values so that downstream metering, monitoring and protective relaying devices know what the electrical system conditions are and allow the Main's circuit breaker to act accordingly. These devices work well, but they are cumbersome, expensive, analog and not inherently self-monitoring as provided by the present invention.

As an example—a 15,000 volt Mains conductor connection, which one cannot safely directly touch with a human hand, could be proportionally transformed (and thus is still in analog form) with a Potential Transformer down to a 120 V signal (similar to a house light bulb's voltage) that could then go into a meter and provide a somewhat accurate accounting of the ever-changing values of the system's voltage. A corresponding Current Transformer can monitor a Mains current of Thousands of amperes and produce on its proportional output a 5 amp analog signal which is now at a level such that it can be directly wired into a protection or metering type device. This meter or protective device could be connected to a controller which will then determine if action by the circuit breaker is needed or not. This prior art technique and these transformer devices are rugged, reliable, and accurate. They exist in many places. But, as mentioned, they are heavy, expensive, bulky and provide proportional, analog, output values. And, these analog signals will ultimately need digital conversion by the modern microprocessor-based relaying, metering, monitoring and control devices that such signals will be fed into.

The prior mentioned devices (CTs & VT/PTs) represent the electrical power industry's go-to technology for more than a hundred (100) years. For medium voltage sorts of switchgear applications which are meant to ascertain the real time system voltage and current ratings so as to make use of that real time metrological information for secure operation of the switchgear, CTs and VTs are almost exclusively today the proportional sensors of choice. Standard metering, protection and control transformers (whether of the voltage or current types) are electro-magnetic devices built around magnetic iron cores with many copper windings and enough insulation to protect the surrounding "energized equipment" from the thousands of volts present. In the medium voltage and current ranges mentioned above for switchgear—each transformational device mounted on one (1) of the three (3) phases of the system's voltage and its associated current conduction path's is likely to be about the size of a shoe box or two and weigh about a dozen (12) pounds to fifty (50) or so pounds each. They are voluminous, heavy and relatively expensive (as compared to the present invention).

At a minimum, six (6) such devices (one CT and one PT per phase for each of the three (3) phases) of a three phase system would be applied. This becomes very bulky, costly and heavy. Additionally—if it is desired to know the voltage across an open switchgear interruption gap—(necessary for synchronizing both sides before closing a breaker) an additional set of voltage sensors (VT/PT's) must be installed on the opposite side (the load side) of the breaker's three (3) phases. Adding such voltage sensing across the open gap allows for the comparison of the voltages on one side of the circuit breaker vs. the other side of the breakers' open contacts. This enables knowing that the AC voltages on both sides of the breaker are in synchronization. It is desirable (indeed often mandatory) that a breaker can ONLY be closed when both sides of the open breaker are in phased synchrony with each other. Now we have nine (9) devices, each reaching the size of a shoe box or two (2) and each easily weighing many tens of pounds, consisting of much copper, and expensive. Clearly this is undesirable if it can be replaced by simpler, less expensive, digital sensing, and less bulky devices.

At voltages approaching 40,000 volts and currents approaching 5,000 amps (or more) values presently, the collective voluminous bulk of these nine (9) such transformers could easily cover the top of a standard desk and collectively can weigh upwards of 300 pounds or more in copper and steel. This is not compact, light nor inexpensive. And, again, the prior art systems provide analog readings. A compact, digital, lightweight, highly accurate device for monitoring voltage and current at the above medium voltage and amperage ranges is highly desirous and if it were also self-monitoring it would exceed all present industry devices and practices. The present invention is believed to be a significant step in these directions.

Using the prior art stated devices is the current state of the electrical industry—therefore, everyone making, selling and buying these medium voltage switchgear devices simply takes these magnetic, iron core, proportional analog, transformational sensing devices as a given, and assumes the size, weight and money are the cost of doing electric-related business with regards to the safe supply of medium voltage switchgear. Prior to the present invention, no alternative existed which is digital, lightweight, extremely compact, accurate, self-monitoring, and cost effective. And, such a system has not been integrally applied to medium voltage draw-out type of switchgear.

CTs will generally output a 1 or 5 amp nominally proportional (and thus analog, not digital) signal and PTs will generally output a 120 VAC nominally proportional analog signal. All modern day protective relaying, metering and control devices that connect to these proportional transformed signals have an initial input circuit board (an IC) that processes these robust analog signals and, in some way, digitizes them so as to be able to then pass these now digitally "massaged" versions of the analog signal into the next circuit board which is the micro-processor portion of the relaying, metering and/or control device. Once processed, the "brains" of the analyzing device (the micro processing board) will then "output" or in some way "take action" that it is designed and programmed to provide. Examples of things such devices might perform could be to read, record, display and bill for energy usage, or to trip a breaker in an overload condition, or to open a valve when the voltage is proper on a ramping up-to-speed generator. The industries' myriad applications are near boundless.

During the last 25 to 50 years—there have been a number of advances in electrical sensing devices that are much smaller, lighter and lower cost than using iron core devices yet can obtain acceptably accurate proportional signals to those of the Mains. However, each of these devices has shown to have its own serious drawback(s). Therefore, none have gained much traction to create for itself an industry-leading percentage of the sensor market and move customers away from the well-known traditional CT/VT approach. The present invention can overcome this well entrenched industry inertia.

BRIEF DESCRIPTION OF THE INVENTION

The present invention takes two (2) well known and established versions of these newer sensors and provides a creative "twist" that makes them very much able to replace the traditional approach. More specifically, the prior art uses voluminous and weighty CT and VT/PT devices in a switchgear. These bulky iron core devices generally mount around the main line and/or load conductors in the case of CTs and mount directly or indirectly to electrically "touch" the conductor in the case of PTs. In contrast, the present invention will integrate and likely mold a Rogowski coil(s) and a Capacitive Voltage Divider (CVD) or similar device(s) (the latter can be in one of a variety of configurations including resistive and inductive dividers) directly into a large electrical "plug" that exists within draw-out switchgear known as the Stationary Primary Disconnect Bottle Assembly (hereafter SPDA) (colloquially aka "the Primary Bottle").

The present invention, the use of a Rogowski coil along with a version of a Capacitive Voltage Divider or similar device, then to an integrated circuit with with look up tables and data accumulator or collector for digitization of the signals and time stamping for comparison purposes need not necessarily be exclusively used in a medium roll-in and roll-out switchgear but, rather, the technology can have a variety of other usages and be a stand-alone yet connectable device for other purposes as will be clear to those of skill in the art.

The Rogowski coil is, as is well known, a simple "open in the middle" toroidal set of windings which extend circularly to form a coil with multiple windings. Having a Rogowski coil molded directly into the outside of each of the Primary Bottle Assemblies (as they are also called) of the switchgear, in lieu of the CTs, will save dozens of pounds in weight, volume and expense. In addition to the Rogowski Coil(s), according to the present invention, a Voltage Divider (in one of its configurations) is additionally encased within the molding of the Primary Bottle Assembly. In the present invention, the Rogowski Coil and the Voltage Divider are each/both molded into a single "Stationary, Primary Disconnect Assembly" (aka—Disconnect Bottle & Rogowski coils by design are air core devices). They do not need nor use the heavy iron cores that are part and parcel of magnetic transformational devices such as CT's and VT's. Therefore, by extension, they do not have a problem of magnetic "saturation" which renders magnetic transformation devices incapable of proper operation under unduly high magnetic flux situations (i.e., short circuits).

However, Rogowski coils can only provide at their terminal points a rather small voltage (millivolts) of an extremely low power signal which will be directly proportional to the amperage of the primary current that is being carried in the Mains Conductor passing through the center of the Rogowski coil. The output of Rogowski coils are highly linear which is a very desirous characteristic when attempting to extract a proportional signal and use this lower proportional outputted value to represent and calculate the actual Mains Value. Highly linear means the Rogowski coil will provide a proportional signal over a very wide range of Mains current and will not have magnetic saturation shortcomings (as CTs might experience) due to lack of enough iron core magnetic material in high short circuit conditions.

It is however a dis-advantageous property/condition of Rogowski coils that they—

A—have a very low value of a proportional output voltage value that relates to the Mains Current (.i.e., micro to milli-volts). This will necessitate very sensitive measuring devices for reading output values of Rogowski coils when the value of the Mains Current is low and B—The huge output signal range requirement of the Rogowski coil devices (from near zero micro-volt outputs when the Main's Current circuit is lightly loaded, to over many volts of Rogowski coil output signal when 150,000 amps peak in some short circuit conditions is present) is far too broad to be sensed accurately at the low end (when accurate metering levels are needed) and not to do damage to its own sensors under high fault current values (when accurate measurements are needed for protective relaying action under high short circuit fault conditions)—or vice versa, that a high end capable signal sensor (for protection purposes) would additionally not be able to accurately sense a rather lower Mains Current value for normal day to day metering needs and C—the signals will be swamped.

To put this more simply—it has been difficult to use a Rogowski coil over its very wide range without having rather expensive equipment attached to its output to be able to monitor the full range of its output with reasonable accuracy and reliability from the low to the high end of expected output. It is therefore the current state of the art that Rogowski coils—when used—take their output signals and put them into an "amplifier/converter" device to integrate and transform the very low-voltage, low-power signal and then step them back up into a 1 or 5 amps analog signal so that this translated and repowered output signal can then be directly inputted into a traditional, standard metering device. Since metering devices do not mainly focus on short circuit conditions, this "massaged" and repowered Rogowski coil output is a bit cumbersome to create but reasonably cost effective and acceptable in applications where the user is merely trying to replace a CT with a lower cost signal generator to work with their standard metering devices. Very few makers, prior to the user/employer of the present invention, would take a chance on using these inputs for protective relaying devices and even fewer would do so at medium voltage levels where the short circuits can reach 150,000 peak amps or more. And a failure of the protection scheme could take down a neighborhood—not just a circuit.

The present invention circumvents these Rogowski coil shortcomings and/or its circuitous ways of employing these low energy sensor output devices. By physically molding such a Rogowski coil into the insulative body of the Stationary Primary Disconnect Bottle Assembly (SPDA) of a draw out type of switchgear, the Rogowski coil is assured to be solidly mounted, well positioned concentrically and proximally locked into position with regard to the Main conductors. And because the SPDA molding is specifically strong mechanically and dielectrically by design, it becomes a perfect loci for the sensors' location. Indeed the present state of the industry generally mounts its iron core magnetic CT devices in the exact same physical location—around the same SPDA.

Similarly, the construction of an SPDA is such that it will often have some form of metal clamping hardware holding the Mains conductor within its dielectric molded center. "PEM" type inserts (or similar) are molded into the dielectric material which are used to bolt the SPDA to the rear metallic wall of the switchgear cabinet or enclosure. This is shown in FIG. 1 of the present document. These two (2) hardware points (the Mains Conductor holding hardware and the switchgear cubicle mounting hardware) will, by design, now be either at full electrical System potential (the conductor hardware) or at System ground potential (the switchgear metal enclosures are always solidly grounded metal). This is exactly what the other component of the present invention needs. The capacitive voltage divider (in one of its various forms) needs, for it to operate properly a source of the high input voltage and a grounding location. Therefore, during the molding process of the SPDA of the present invention—the capacitive voltage divider component of the device will have one of its ends connected solidly to the Mains' conductor's metallic retention PEM hardware, and the other electrical end will be attached internally to one of the molding PEMS that ultimately will be bolted to the grounded metal rear wall of the switchgear cubicle. Upon bolting that SPDA to the switchgear enclosure's rear wall—the voltage divider will be electrically spanning the electrical distance of full voltage to solid ground which is exactly how the device is designed to effectively operate.

The capacitive voltage divider will have leads, one to power the device by being directly connected to the Mains and the other connected to the ground. This will provide an indication of the voltage going through the device, which will be "divided" by the series of capacitors. This output is fed to the Integrated Circuit, just as the Rogowski coil's voltage is fed thereto. And, from the integrated Circuit, the signals are passed to the integrated circuit where they are considered in view of prior developed look up tables calibrating the device with respect to a known set of highly reliable standards for the parameters being measured. There, the signals are digitized and adjusted by the look up tables and then sent to a data collector, where time stamped and analyzed.

The Capacitive Voltage Divider (hereafter often "CVD" (or similar voltage dividing technology) and the Rogowski coil are two (2) components; one electrically "touching" the Mains conductor (the capacitive voltage divider) and the concentrically wrapped (the Rogowski coil) in an insulated fashion (via the primary bottle molding) around the Mains conductor of the switchgear—having been molded into the SPDA (Stationary Primary Disconnect Assembly—i.e., the Primary Bottle).

It should be appreciated that the wiring of the output signals of both the Rogowski Coil and the Capacitive Voltage Divider are provided so as to be able to suitably connect their respective outputs to another component of the present invention, also preferably to be molded onto or near the SPDA assemblies. The respective outputs of the Rogowski coil and the CVD are wired to an adjacently-located small integrated circuit (an IC) board which will also be preferably molded onto or provided near one of the cylindrical ends of the SPDA, i.e., on or proximal to the many various SPDAs or bottles. These two (2) sets of signal output wires (one from each Rogowski coil (providing a proportional measurement of the Mains current) and one from the CVD (providing a proportional measurement of the Mains voltage) provide the input "information" to the integrated circuit board molded near, onto or into the SPDA of a medium switchgear. Those signals are adjusted by a set of look up tables on the integrated circuit and after digitization, can be stored in memory. The integrated circuit board is in essence a high speed sampling circuit that will take rapid "snapshots" of the Rogowski coil and CVD's outputs and immediately digitize their values.

Each SPDA (Primary Bottle) will have no less than one (1) molded in place low power sensor for current and no less than one (1) molded in place low power sensor for voltage. The outputs of the low power sensors are to be wired to a small, molded into place integrated circuit board preferably located on or near the SPDA(s). The integrated circuit board is intended to be an appropriately designed analog to digital (A to D) convertor and will have sufficient range and shielding to accept the bandwidth of signals from both the Rogowski coil and CVD under both "normal" and "full short circuit" conditions. Because of the wide output range of the Rogowski coil's Proportional output, the A to D circuit will employ well established circuit schemes to protect itself, while simultaneously providing highly accurate readings from near zero amps to the highest system short circuit levels (often approaching 200 kAIC peak).

To accomplish this protection, the integrated circuit board will have numerous nearly identical parallel channels for routing the Rogowski coil signal readings within its borders. Each of the parallel circuits will be "tuned" so that the Rogowski coil's output signals can be sliced up into safely readable ranges. Therefore, no high output from the Rogowski coil under heavy overload and fault conditions will be allowed to damage the A to D reader of the IC. And none of the very low values of the Rogowski coil output when the Mains circuit is lightly loaded will be too low to read within specified accuracies and output a digitized accurate value.

By employing parallel circuits which will be "tuned" for accurately reading from very low to very high levels of Rogowski coil output values the invention will exceed the current state of the art for Rogowski coil sensing in this application setting. As the Rogowski coil output values rise due to the increasing Mains current from low levels to short circuit levels—the lower level parallel sensing circuits of the integrated circuit board providing A to D will all be turned off (or shunted) in an appropriate high speed manner so that no damage occurs to them. As the Rogowski coil signal outputs rise to levels above their input range, the next parallel channel will sense if the value is within its "sweet spot." Continuing in this fashion, the A to D integrated circuitry will select the "best" parallel path that can then be digitized providing the most accurate output value accordingly. In effect the preferred embodiment of the invention places a half dozen properly "tuned" parallel path digitizing, integrator circuits on a common IC "chip" and slices up the Rogowski coil original output signal so that whichever value of signal is selected to be read, digitized and exported—it is always being done by a path or circuit that considers the monitored value to be comfortably within its sensing and reading range capabilities. That integrated circuit board will take the sensed information from its SPDA Main and immediately transform those proportional current and voltage values into a high speed, accurate, streamable, now-digitized (digital) signal output.

The digitized output of the integrated circuit (digital data) (one each located on each SPDA) are then passed by another aspect of the integrated circuit—namely a look up table. This is loaded, too, on the integrated circuit and is a result of comparing the voltage and current of a well known standard at the place of manufacture to the actual voltage and current provide through the switchgear. In effect the look up table provides a digitized signal for the voltage and current which is calibrated to the known standard.

From that, the signals are directed to a controller a/k/a a "Data Collector/Collector Accumulator" (hereafter "D.C." or "C.A.") which will preferably be mounted proximal to the six (6) SPDA molded "Bottle Assemblies" carrying the combination Rogowski Coils and the CVDs—one SPDA for each Line or Load connection of a three (3) phase electrical system. The Data Collector or Collector Accumulator can be programed to "understand" a variety of machine and/or computer languages or be provided with translation capabilities so that the output of the time stamped data can be used and transmitted downstream in multiple and various formats and languages. Once that data is streamed to "the cloud" other usages of the data may be desired and various analysis and uses can be accomplished. It is to be understood that Stationary Primary Disconnect Assemblies (SPDAs) are a present standard component within medium voltage drawout switchgear. They are specifically made in a molded fashion of insulating material and are very strong to hold a section of primary conductor materials within the so-called "bottles." The molding is then bolted to the switchgear enclosure and becomes a female plug into which the drawout circuit breaker can connect. It is very much similar to the insulated plug receiver in one's residential home wall (with the noted exception that it must be much bigger and stronger so that it can mechanically and electrically carry 100 times (or more) the voltage and current than a residential wall outlet plug is designed to carry (i.e., 15,000 volts vs. 120 volts or 3,000 amps vs. 15 amps).

Because the stationary primary bottle assembly (SPDA) is already a part of the medium voltage switchgear and it is one of the generally currently acceptable places to mount existing large, heavy, bulky technology serving as Current Transformer devices, it becomes an ideal location and solution to remove the present day CT device and to modify the primary bottle assembly molding somewhat so that if can now have molded into or around itself two (2) small, lightweight, low power, yet accurate sensing devices that can (under conditions that will hereinafter be explained) replace both the CT (current transformer) and the separately mounted, large, heavy VT (voltage transformer). The Rogowski coils and the Capacitive Voltage Dividers are smaller, lighter, less expensive and can wrap around and be supported by the SPDAs or bottles.

It should now be well noted that the switchgear in its existing form is "expected" by the customer to contain six (6) SPDAs in any event. Once the manufacturing technique for embedding the Rogowski coils, CVDs and A to D Integrated Circuit with look up table integrated thereon and Data Collector circuitry is decided—there is very little added cost to the normal, basic design of the SPDA which is already quite well known. These modest additions have now turned each SPDA into not only a massive power plug (which it already was)—but it is now a "Smart" power plug, producing an accurate, digital, high speed, exportable output of the calibrated signal values of voltage and current present on its Main's conductor in near real time (within microseconds). This is a solution to a real problem; with the solution being lower cost, less bulk and weight and highly efficient.

Since the SPDA of the prior art medium voltage switchgear, by its very nature, has a large piece of primary conductor molded into its electrically insulated molding, and has previously (and presently) mounted current sensing devices such as a CT mounted on it; a Rogowski coil can instead be mounted circumferentially around the bottle for the mains conductor directly into the SPDA molding during the process of creating the SPDA. This is a perfectly suitable platform for such a device/mounting. Additionally, as potential devices such as present technology VT/PTs or Capacitive Voltage Dividers (CVDs) need to "touch" the conductor and since the SPDA by its very nature is totally molded around and "clamping" to the piece of primary conductor, it, too, presents the perfect location to install and mold a capacitive voltage divider (CVD) adjacent to the Rogowski coil within the molded enclosure of the SPDA. One (1) SPDA for each of the draw-out circuit breakers' six (6) connection points is to be provided, i.e., one (1) SPDA for each Phase's Line side and one (1) SPDA bottle for each phase's Load side, can be provided. The switchgear's metal cabinet or enclosure is by design a grounded metal enclosure. Therefore, bolting the SPDA bottle assemblies to the enclosure are, by required design standards, grounding the SPDA bottles (and by extension the CVDs which will be secured to the conductor on one side and to the cabinetry or ground, on the other side) once all is in place will efficiently operate. By connecting the distal end of the capacitive voltage dividers (CVD) circuitry to the Mains, the invention effectively creates an electrical bridge from Mains conductor voltage, i.e., the piece of conductor molded within the primary bottle assembly through to ground for the capacitive voltage divider (CVD) circuit. Both the Rogowski coils and the CVD circuits will have wiring that can be wired to the digitizing device (an Analog to Digital, A to D, custom IC Board) essentially "a sensing gauge" with microchip circuitry which is also specially designed to be molded onto the SPDAs. Other locations can be suitable but having the IC placed near or upon the SPDAs is considered ideal to avoid any environmental stray signals.

With the two (or more) "smart" sensors molded into the stationary primary disconnect assemblies—the SPDAs (aka stationary "bottle" assemblies)—proportional, low power output signals are generated from the outputs of these sensing devices. In a medium voltage environment of relatively high electrical and magnetic flux—these signals are well known to have downsides when trying to run them any distance within the general locality of the point of signal generation. Normally, the signals are so low in power they cannot go very far and the low power output signals can easily get "swamped" by other stray flux-generated signals such that the ultimate "reading" device will not know if the value(s) coming to it is correct. And therefore, the reading device may output potentially erroneous values and take erroneous actions.

In addition, the low value of these signals is such that exceedingly few devices can even accept and/or use them as an input value and, generally in order to use a Rogowski coil signal—manufacturers put the signal into what amounts to an amplifier and converts and powers up the milli-amp signal to a 5 amp output which is then fed back into the inputs of standard 5 amp input metering devices. In addition, the range of output of a Rogowski coil when used for potentially monitoring a short circuit condition needs to go from near zero (0) amps (i.e. very low current usage through the breaker) to nearly 200,000 amps peak under very high fault current conditions. No normal, cost-effective amplifier(s) has such a range. Amplifiers will either be set for the high end prospect of looking for a short circuit signal—which means it won't be able to accurately sense normal operating/lower amperage values or—the more prevalent situation is that the amplifier is set for "normal" operating conditions and it must be turned off to protect itself under short term dangerously high output values when a short circuit exists.

The present invention takes the above into account. It is to be noted that Rogowski coils have and continue to slowly make their inroads as the front-line sensor to send a signal to metering, relaying and monitoring devices. As noted herein, there are drawbacks with the state of these previous and active attempts. Well noted shortcomings include:

1) The very low power signal that can be outputted from both Rogowski coils and capacitive (or similar) dividers means the actual proportional signal intended to be used as in input to some other metering, monitoring or relay protection device can be swamped by the surrounding flux of the primary circuit and any massive surges created from associated short circuits flowing through them. The industry currently attempts to circumvent this issue by putting the output signal into what is effectively an amplifier. The output of the amplifier is then designed to become 1 amp or 5 amps and that signal is sent on to the next metering, monitoring or protection device;

2) The intention of these front line sensor devices is to have a reasonably good accuracy for metering "normal" conditions. Those values are from near zero current (the OFF state) to the nominal current value state (generally 100 to 3000 amps). Here we can already see that any "amplifier" such as that mentioned above has to have a broad acceptable range of input signal values such that it can create a 1 or 5 amp output from the nominal millivolt output of the Rogowski coil while still being accurate at values of $\frac{1}{10}$th the nominal value. That is no easy task—especially when attempting to be small, lightweight, and rather cost effective. These "amplifier" devices add volume, generate heat and by their nature, greatly increase the auxiliary power required to amplify the very low power signal and transformatively step it up so as to generate it into a 5 amp output signal which can then drive a standard downstream device such as a common metering device which, as its standard, takes in a 5 amp signal.

3) Adding to the difficulty of 2) above, a short circuit condition could/would have tens of thousands of short circuit amps flowing in the primary of the Mains conductor. Short circuit values of well over 50,000 amps symmetrical in places of high current density (major urban centers or a large petro-chemical plant) with those symmetrical short values topping 150,000 amps peak are not uncommon. Such massive primary currents would translate into a proportional Rogowski coil output of volts rather than milli-volts. Any such attempted input into an amplifier of signals with such a jump in range value as herein described could/would blow out the amplifiers input and if allowed to pass through likely would damage the output circuitry as well or severely "clip" the output signal and not be able to pass along or save the fault current record for evaluation. One can think of this as grabbing the volume knob on a high-quality stereo system's power amplifier while a song was playing, and turning that volume as fast as you could up to maximum. More than likely the speakers will blow out—and likewise much damage could be incurred by the amplifiers own output circuitry.

4) The integrated electronic component(s) of the present invention (referred to as an Omni Sensor's IC) (the expected size of which should be about twice as large as an ice cube) will mount on (be molded on to) the outer perimeter side of the Stationary Primary Disconnect Bottle Assembly and will be wired directly to the internally molded Rogowski coil and CVD's output device's wiring connections. As the IC's front end takes in the signals from these two (2) low power devices—it will then forward the Rogowski coil signal to a series of parallel (nearly identical) banks of sampling circuits.

Each one of the parallel banks of sampling circuits will be "tuned" for a range of input values. As an instructive (only) example, the configuration of the Sensing Banks might fall along the ranges of—Sampling circuit Bank #1 would be for amperages in the range of 0 to 500 amps; Bank #2, 400-2000 amps; Bank #3 for 1600-9,000 amps, Bank #4 for 8,000-40,000 amps, and Bank #5 for 32,000 to 160,000 amps. Thus, each bank can very accurately handle a range of five or so times its lower value to its upper value. And, each bank has some range to sample signals and amps immediately adjacent its full range. This provides superior accuracy and a great margin of safety, by design. Each bank range in turn overlaps the previous range so that this entire device can accurately sense from near zero to 150,000 peak amps (or more) with great accuracy and no clipping of output signal. Each range will be protected on the high side so that it instantaneously turns off before any damage occurs and it lets only the next higher parallel sensing channel monitor, read and report the input signal value to the Data Collector or Collector Accumulator.

Only the specific parallel path channel, finding the input signal value to be in its "sweet" spot, i.e., within its range, would be the channel to output the data from the SPDA (to the Data Collector or D.C.). Digital signal sensing & reporting such as herein described are, with pre-calibration at time of manufacturing, very accurate, robust and inexpensive (compared to the present method of providing proportional analog output values). Protecting them from fast rising surges with even faster acting surge suppression techniques are commonplace and trivial with today's IC's. Today's properly specified "off the shelf" signal processing IC chips have such protections standard. Additionally, packaging a half dozen to a dozen such parallel channels onto an IC and into an ice cube size footprint is commonplace in today's design capabilities. Each channel of each IC on each SPDA will be tuned and calibrated during the manufacturing process for its pre-specified range. The Output of each SPDA will be digital, high speed, accurate over a very wide range and will not need to be amplified. This, too, is highly desirable.

It is that "need" to re-amplify the Rogowski coil signal that is another major limitation and drawback of prior art employed Rogowski coil device schemes. The SPDA's IC output, however, will be inherently digital, self-monitoring and streamable to any third party relay, meter or control system that wishes to input the Omni Sensor's streaming data. The Omni-Sensor™ will stream its digitized (directly off the IC) values using well established open protocol formats (such as IEC 61850 or similar). The digitized signalings being transmitted, even though at low power, will not become "swamped" by the locally developed, analog, medium voltage fluxes of the general switchgear system. Placing the integrated electronic sensing circuit device directly on the SPDA (with electrical shielding as may be needed) will ensure that the low power signals of the Rogowski coil and CVD devices going directly (and a very short distance) to the SPDA's IC's are never compromised. And the digitized output from the IC ensures that the digital output signal is clear, robust and digitally accurate for all subsequent intended uses downstream, as to be described herein below.

The raw sampled values are taken at microsecond speeds meaning that there are many samples taken within a quarter cycle time period of a (50 or) 60 Hz electronic sine wave. (i.e., approximately 4.167 milliseconds in a ¼ cycle of 60 Hz, which is approx. 16.67 milliseconds). Each rolling time slice is taken and outputted extremely fast, accurately, and informationally rich. That is to say it includes all fundamental and harmonic data information which can be passed directly out of the IC device or somewhat filtered and "massaged" on-board as may be desired (altered to correspond to calibrated and known standards by look up table(s) on the IC. There is nothing particularly special to the quarter cycle time frame; it is simply set forth herein as most of today's microprocessor relays need that amount of time to determine if a fault (short circuit) is occurring. Once the protective relay makes such a determination—it then sends out that "decision" via a dry output contact(s) to the associated circuit breaker's trip coil. The invention therefore is providing many samples to accurately ensure that a "trip of the circuit breaker's" decision is made with solid input information from the components, using the Omni-Sensor™ devices.

The SPDA's IC's construction includes a standard plug jack connector (such as RJ 45, Ethernet or similar). These connectors and similar connections are available now on router devices from companies such as CISCO of San Jose, California and can be referred to as devices for providing Power over Ethernet (POE) devices. This construction will allow ICs to be quickly and reliably wired to the Data Collector/Collector Accumulator or Data Accumulator device as will be discussed. The jack connector(s) will bring control power to the IC from the Data Collector (Accumulator) and take the digitized signals out of the IC back to the Data Collector/Accumulator (D.C.) device.

The above summary describes a very "real-estate" friendly way to extract a high accuracy, high integrity, high sample rate of current and voltage sample value(s) from a medium voltage draw-out switchgear enclosure design. The six (6) sets of streaming data are now digital, high speed and accurate. However in and of themselves they are not as process-ably useful as desired. In order to turn the data streams into usable information—the streaming values are connected from the Integrated Circuit on to the Data Collector (D.C. or aka Collector Accumulator) and processed therein. The present invention can even be expected to detect broken breaker pushrods.

The Data Collector/Collector Accumulator Device

It is understood that digital samples are nothing but raw numbers. These individual values are akin to the individual pieces of a jig-saw puzzle strewn about a large table. They only become of value when pieced together into a specifically proper & ordered sequence. The main purpose of the Data Collector/Collector Accumulator (D. C.) therefore, is to reassemble, time stamp and cursorily and in detail, as required, analyze the six (6) digitized current and voltage samples from each Stationary Primary Bottle Assembly (SPDA) as provided from the integrated circuit from signals garnered by the multiple Rogowski coils and capacitive voltage dividers and to synchronize them to and with each other. Synchronization is a default by-product of the D.C. "reading" or "snapshotting" the six (6) inputs at the same instance. Streaming out the sine waves allows the D.C. to create a synchronized three phase line and load output flow of data that can be both Fundamental Frequency and Harmonic Rich (i.e. Unfiltered) at the same time. An onboard high speed clock signal will allow the D.C. to take the six (6) SPDA IC signals and add a time stamp to their digitized value before sending the raw, integrated and mathematically compared signal(s) on for further processing. Every digital sample along with its five (5) counterparts will have a common clock value. Rebuilding, comparing and analyzing (downstream) the samples back into six (6) sine waves of voltage and six (6) of current easily allows for synchronized overlapping so that the "jig-saw" pieces fit together in micro-second alignments. It is expected that subsequent iterations of the D.C will add an industry recognized Universal Clock Synch input. In this manner, the micro-second alignment can be further overlayed to recognize worldwide temporality. The data collector or data accumulator can import clock synchs such as GPS with its own oscillating running in sub-micro seconds. It can time synch frequency to less than $1/100$ Hz. It is to be understood that time-stamping is a perceived present requirement. The actual time stamping can be accomplished by the D.C. as it takes in simultaneous sample and/or the D.C can send out calibrating pulses to all the SPDA IC's which can then in turn simply report their recently sensed values with an attached time-stamp already embedded with the sampled value.

The D.C. will thereafter review the streamed, time-stamped values and perform certain integrations and comparative mathematical processes. The D.C will be able to compare the line and load current and voltage values of each phase, thereby being able to verify that what is coming in—is what is going out, i.e., it is a "baked in" feature of the invention that it inherently, and automatically is providing itself with a 100% self-check and self-calibration function. The D.C. will be able to compare line and load phase angle and provide watchdog permissives to allow (or prevent) closing in on a synchronized (or un-synchronized) set of system conditions. The D.C. will automatically be able to monitor frequency (by counting the zero point crossings of the digitally streaming data values) and it will be able to analyze, verify and confirm the phase angles between A-B & C phases on a continuous near real time fashion. The D.C. will automatically be able to provide the next downstream device (whether protection, metering or control) with a signal rich platter of instantaneous system conditions that can strip out and only provide System Fundamental values if desired, or Full Harmonically Rich Content and Alarm information (both digitally and with dry contacts) when programmed presets are reached or exceeded.

The Data Collector (D.C.) will be so tailored so as to output its now mathematically massaged values such that they can be inputted into Relays, Meters and Control devices of any third (3rd) party manufacturing supplier that currently uses standard CT's and PT's and wishes to provide the present Omni Sensor™ device with an interface plug to go directly to its processor board and bypass the third party's device's initial analog input board(s). This, too, is a perceived advantage. The Omni Sensor™ will be as agnostic as CT's and PT's are currently. As long as the third party vendors wish to allow for this method of source signal input to their devices, they will be able to provide a fully functional protection, metering, monitoring/control system for a fraction of weight, cost and volume associated with the present state of the art CT/VT sensor inputs.

The Data Collector-Collector Accumulator (D.C. or A.D.) device will massage (integrate, calculate and compare) the various raw digital data samples to create a useful signal flow that can be used by either an OmniSensor™'s NORAAD (Native Onboard Relay and Administrative Device) or any other third 3rd party modern electronic metering, relaying or control device that desires to accept the Omni Sensor™s digital data flow format. The Omni Sensor™ will intentionally be designed to use one of the power industry's more standard open source format(s) (such as 61850) so that the Omni-Sensor™ system can, overtime, be an open source industry standard component to replace CT and PT devices currently used for metering, monitoring and control. Indeed, it would be beneficial to provide the Omni-Sensor™ such that third parties could themselves calibrate and program the outputs to work more seamlessly and accurately with their own specific microprocessor devices.

Downstream NORAAD devices (whether of the Omni Sensor family of products, or any 3rd party relay, meter or control device) can resolve the information to do any sort of math on the signals as may be desired. (The D.C.'s initial version however will (may) have built into its processor the ability to determine short circuits. This will be the fastest way to protect the associated electric system, its circuitry and mechanics. When used with a NORAAD device, the "Trip" signal can be set to go straight to the breaker (via a built-in output) contact or to the NORAAD for verification, discrimination and action as decided by the User. As iterations of the D.C. progress, more of the NORAAD functions can be pushed back up into the D.C.

The Inherent Line/Load equalization self-verification function ensures that what goes in, must come out (or, if not, there is a ground fault). This self monitoring feature is also believed to be of great value. Voltage sensing will enable Under/Overvoltage protection and synchronized closing capabilities. Under/Over frequency as definite value or rate of change are values that the downstream device can monitor, report and make actionable. Definite time overcurrent protection can be easily put into the D.C. followed thereafter by directional overcurrent protection.

The SPDA IC will transmit the high speed, accurate, (adjusted by the appropriate Look up table on the IC) digital signals to the Data Collector/Collector Accumulator which will read the group of six (6) samples of data at the same instance in time and then analyze the same. Using a Rogowski Coil, a Capacitive Voltage Divider (CVD), with an onboard SPDA IC (integrated circuit) turns the draw-out switchgear's primary disconnect into a "Smart" disconnect device, now replacing all the large, voluminous, heavy, expensive analog signal-generating devices of the prior art. There is thus a tremendous cost, weight, and monetary savings as a consequence of using simple and lightweight Rogowski Coils and Capacitive Voltage Dividers (CVD's) (molded together) and with integrated circuitry and then to a data collector, all into or onto an already existing device within the switchgear (on the SPDA) in lieu of the heavy, bulky and expensive copper and iron core transformers currently used.

The present invention is also self-monitoring, because whatever current goes in to the line side SPDA assembly's Rogowski Coil must, of course, come out (the values of the current can be simply compared) of the SPDA on the same phase's load side. If there is a discrepancy which is detected between those two data points at or about the same instance of time, then either current is lost somewhere as a consequence of a ground fault situation or the Mains sensing device of an SPDA itself (one of the two Rogowski coils) is malfunctioning. Either way an alarm alert (digital and dry contacts can either or both be employed) is sent to notify the equipment's operations and maintenance personnel. The self-monitoring feature provides a continual stream of long-term maintenance cost savings, as well as a very important reliability self-verification function which is not normally available as part of the prior art devices.

And, the current invention, by the use of simple Rogowski Coils and Capacitive Voltage Dividers (CVDs), molded together and surrounding the conductor(s) in the switchgear device, are each connected to an integrated circuit, which will result in the use of the analog converted signals into digital form which is far more useful than the prior art analog and amplified signals from the larger, bulky, heavier and expensive devices. It is expected that the invention will initially find its application on the inventor's Assignee's own circuit breaker/switchgear product line. In this way it can work through any software or hardware application "kinks" in a specifically applied environmental approach. Once established as viable (and indeed preferable)—the invention will be able to be provided in myriad stand-alone formats to all manners of applications, equipment suppliers and end users, (Electrical Power) industrywide. As the products acceptance and volume increase—the costs will naturally lower and the product will eventually find itself well poised to be installed on low voltage switchgear and similar electrical power equipment which requires CT/VT sensing devices, at a lower price point then does Medium Voltage equipment.

By using a capacitive voltage divider (CVD)—available in various configurations, and a Rogowski coil packaged together in an epoxy (or similar) molding surrounding the "bottle" of the medium voltage switchgear (in this initial case—made specifically for Citadel breaker and switchgear made and sold by National Breaker of Middlebury, CT.) the SPDA (primary "bottle") itself can become the proportional signal generator. Presently the industry state of the art uses said stationary, primary surrounding "bottle" assembly as the mounting location of a large, heavy "donut style" iron core CT around the conductor in the switchgear to perform current sensing of that particular electrical node.

The disclosed invention herein is considered a marked and significant improvement in bulk, weight, cost, and other factors. The Data Collector (D.C.) (a/k/a Data Accumulator) will be available so as to speak multiple languages (formats). Therefore, it will be able to be packaged with any 3rd party relay, meter or control device where the 3rd party seller wishes to coordinate their micro-processor input formatting with the presently referred to as the Omni-Sensor™'s accurate, high speed, streaming data output.

This placement of a low power analog Rogowski coil and CVD sensing device(s) in itself is not sufficient to complete the task. Because these low power analog output signals are so small—they will get swamped by the stray flux from the surrounding medium voltage environments such that these proportional signals will neither make it all the way to the input of the metering and relaying device nor be reliably trustworthy and useful if they do get to their intended input location(s). Additionally, the levels of these signals will be too low and incapable of being the driving signals for said protective, metering, monitoring or control devices which normally take a one (1) or five (5) amp CT input and a 120 VAC PT input. Rogowski coil outputs are measured in millivolts and CVD devices in single digit volts.

The invention demonstrates however, that it is possible to package (mold) a micro-circuit (eventually—a customized integrated chip) directly onto each one (1) of the six (6) stationary primary disconnect assemblies (SPDAs or the bottles) of a draw-out medium voltage switchgear device. The bottles will have molded into their outer circular wall, a Rogowski coil and capacitive voltage divider and immediately adjacent to the two (or more as needed) low power sensing devices—i.e. the Rogowski coil and the capacitive divider, will be provided the IC micro circuit for converting the low signals to digital, using look up table on the IC for standardization (having been previously obtained by a standard calibration of the device before delivery to the customer by using well known parameters) and then directing the same to a data collector for time stamping and analysis. This very close, molded proximity of the IC micro-circuit to the low output signaling devices, along with any modestly additional electrically protective signal shielding, can easily be molded into the SPDA's packaging such that it will easily allow these low level signals to reliably make their way to the micro-circuitry ("the integrated chip"). The micro-circuitry can (using very low cost presently available state of the art circuitry) sample the low power output current and voltage signals, dozens to hundreds of samples per cycle. Such sampling rates will produce exceptional resolution and accuracy for analog signal reproduction mimicking. Any manner of protection, metering, monitoring, control, harmonic content, etc. calculations will meet or exceed the current industry's standard expectations for virtually any level of accuracy and speed of operation by this method of signal acquisition.

Once inside the IC micro-circuitry ("chip")—the chip will sample and digitize these originally very low power Rogowski coil's and CVD analog values. The result will be a secure streaming series of digital values (i.e. stream the real time current and voltage values directly out of the micro-circuitry). All of the digitized signals will be pre-calibrated (using the IC loaded look up table during manufacture such that within any line to load pair, the values are well within a fraction of a percent over the voltage/current sampling range of existing sensing devices. This digitized output is now no longer susceptible to signal swamping and information loss as would have been possible given the original low power devices' analog outputs. Nor will these digitized streaming signals need to be analog-amplified (as is the current case of using low signal output devices) so as to be able to enter the input side of associated industry collectors/integrators or"brains," i.e., standard metering and/or relaying protection devices which currently are designed to take a one (1)—or five (5) amp input from a current transformer and a 120 VAC nominal signal from a voltage transformer.

The matter of low power analog signal amplification is herein eliminated by the next step in the invention. As mentioned, these low power sensing/digitizing entities are referred to as the Assignee's "Omni-Sensors™". The next step in the invention is to take the highly accurate real time voltage and current digitized streaming signal values of the "Omni-Sensor's" directly to (and in reasonably close proximity of) a Multi-Channel Transforming Platform (the Data Collector or Collector Accumulator). This will convert the digital streaming values into a language (a protocol) that most of today's protection, metering, controls and communications devices internally already use. This transforming platform will be able to take initially up to six (6) Omni-Sensor™ signal inputs and eventually expand to twelve (12) digital signal inputs. The platform will simultaneously "read and store" these digitized signals per instance, i.e., streamed values of voltage and current and will add a system-synchronized timing value, such that now every digital output sample signal from all six (6) SPDA points (consisting of three (3) phase line and three (3) phase load, in current and voltage) can now be made coincident to each other—(i.e.— the System internally establishes its own three (3) phase clock sync for each recorded reading). (The reason for twelve (12) inputs instead of six (6) is that each SPDA molding "may" include, but not be limited to; a 100% dual back-up to provide higher reliability, auto swap-over for a failed Rogowski coil, ease of maintainability, and sensing range options for changes in system load circuitry, or optionally a more narrow band of highly accurate readings for revenue metering).

That, too, seems to be a good distinguishing characteristic or feature in the early adopter stage. And, doing so, the system can later be used to drastically improve low end accuracy or "un-clipped" high end fault values. The extra materials cost in providing multiple Rogowski coils, Capacitive Voltage Dividers and ICs is miniscule compared to the System's reliability and enhanced self-monitoring value. And, because whatever amount of current goes in—must come out (or something is wrong or a fault is present)—the two (2) line/load SPDA bottles that are in series for each Phase will act as calibrators and verifiers of each against its same phase "Other". When the present invention, referred to as the "Omni-Sensors™" is initially factory built—they will be bench tested and pre-calibrated so as to be set to be well within a fraction of 1% of each other. A look up table can be provided to the IC for use in this regard.

Should their mutual readings ever drift from each other (within the accuracy band)—there is either a Ground Fault siphoning off "leakage" current, or there is a need to replace one of the primary bottle systems, i.e., the Omni-Sensor™s.

From the Data Collector (the D.C. or Collector Accumulator) platform, a properly protocoled ethernet signal will emerge and be able to plug directly into the digital input layer of most modern micro-processor protection, metering and control devices (the collectors, integrators or "brains"). Basically the D.C. output is now able to circumvent the needs for both the established current state of the art CT/VT/PT transformers outputs and the "massaged" signals of the protection, metering and control devices' initial layer of input board. This cost savings (elimination of the initial input board of all analyzing devices (i.e., Relays, Metering and Controller Devices) can result in large cost savings to the manufacturers and/or the buyers of these relay, metering and controller devices that will now be "plugged into" OmniSensor™s instead of traditional CT/VT's.

As all such manufacturers will see the inherent advantages of this input signal generating technology—they will in large measure make the tweaks necessary to seamlessly work with the Omni-Sensor™ System (i.e., add a plug to input the streaming data directly to their processor boards). The initial OmniSensor™ system will ultimately provide the industry with its own NOORAD "box" to provide the protection, metering and control functions herein needed as well as the upstream power to send control power down to the multi-channel transforming platform and individual sensors. As the industry moves away from the traditional CT/VT transformer way of generating proportional system signals, all manufacturers of relay, meters and controllers are expected to appropriately modify their own devices to work in the new digitized environment.

Once this approach is accepted—every relay and metering company in the industry probably will, as standard, replace their front end boards with an input jack to take in the digital signal(s) of the Omni-Sensor™s rather than the analog signals of dozens to hundreds of pounds of CT's and VT/PT's. The Data Collector will export the synchronized, modified, and digitized values in such a manner and format so as to conform to the major "languages" employed by the "second" (2nd) Boards (the microprocessor boards) of all present metering and relaying devices. Whether they take a streaming series of digits, a 61850 format or any other manner of data streaming protocol—the Data Collector can be programmed and supplied to output its data stream to align with the microprocessor input needs of the most well-known industry standard's-driven electronic metering and relaying devices. In other words—the Omni Sensor™ system of the present invention is expected to become universally usable by every manufacturer of this type of equipment as CT's and PT's have come to be known and employed.

With the two (or more) "smart" sensors (Rogowski coil and capacitive voltage divider) molded into the stationary primary disconnect assembly, the SPDAs (aka stationary "bottle" assembly); low power output signals are generated from the outputs of these sensing devices. In an environment of relatively high electrical and magnetic flux—these signals have well known downsides especially when trying to run them any distance within the general locality of the point of signal generation. Basically, 1—The signals are so low in power they cannot go very far and 2—The signals can easily get swamped by other stray flux-generated signals such that the ultimate "reading" device will not know which of two or several values coming to it is correct. And therefor as a consequence, the device will output potentially erroneous values and actions. In addition, 3—The low value of these signals is such that exceedingly few devices can even accept and or use them as an input value. Furthermore, 4—generally in order to use a Rogowski coil signal, manufacturers put the signal into what amounts to an amplifier and converts the milli-amp signal to a 5 amp output which is then fed back into the inputs of standard metering devices. Thus, the range of output of a Rogowski coil when used for potentially monitoring a short circuit condition needs to go from near zero (0) amps (i.e. very low current usage through the breaker) to nearly 200,000 amps peak under very high fault current conditions. No amplifier has such a range. It will either be set for the high end prospect of looking for a short circuit signal—which means it won't be able to accurately sense normal operating amperage values or—the more prevalent situation is that the amplifier is set for "normal" operating conditions and it must be turned off to protect itself under short term dangerously high output values when a short circuit exists. The present invention takes all the above into account.

By directly wiring the sensor outputs to a small, micro-chip digitizing circuit board device that will be molded directly onto the outer circumferential portion of the primary bottle assembly and protected with a small amount of electrical shielding, the low power output levels are not unacceptably low for the micro-circuit to accurately sample and read. Because such micro-circuits have a high degree of flexibility—the sensors input to the digitizer will go into a series (up to a dozen as needed) of parallel paths. Each path will be identical to the other except its upper range will be shunted to ground to protect the circuit from high values of sensor input. This operates as a mechanical sorter on a conveyor line sending, for example, small eggs in one direction—medium in a second direction and jumbos into a third. By segmenting the Rogowski coil signals into a number of specific ranges—all values of current from zero to 200,000 can be sampled, sensed, digitized and exported as a fully digitized value. Each of the parallel paths read from its own low to high end. If the signal is above its high end—that path is shut off to avoid damage and the successor higher path takes over. This process continues along until the signal falls within the path that has the best ability to read and accurately report the value. The output value is exported in a digitized fashion with extremely high sampling rates and accuracy. And since the output is digitized, it is no longer subject to stray analog signal swamping.

It is to be noted that located on the digitizing circuit board will be an industry prevalent connector making quick connection from the now Smart Bottle Assemblies to the Data Collector/Data Accumulator (D.C.) assembly. Such connectors can be copper based such as a telephone or Ethernet jack or like an optical connector. Future technological practices for ease of use and cost will determine the choice of those employing the invention described herein. The Smart Bottles—which are a combination of two or more (one at least of a Rogowski coil and one at least of a form of a capacitive (or similar) voltage divider) molded in place around the SPDAs, as low power current and voltage sensing devices coupled with a customized (analog to digital) digitizing integrated circuit. This then outputs digital signals to the data collector. Thus, the sensed signals turn the stationary primary disconnect assembly (i.e. the large bulky sensorless plugs of a draw out medium voltage switchgear) into a "smart" version of its former self that provides high speed, high sampling rate, highly accurate proportional, digitized values of what the old primary bottle assembly used to do in analog fashion, but now without hundreds of pounds of iron and copper hanging on or electrically connected to or around it.

Before moving back to the D/C (data collector) it is to be pointed out again that within each phase of the three phases in such an electrical systems, there is an incoming and outgoing connector (primary bottle) for the associated circuit breaker. When the breaker is open—the voltages across the open contact (i.e. the voltages on the line and the load primary bottle assemblies) can and usually will be different. That is to say—one side is alive and the other is dead (off). In some cases they may both be alive (such as a generator now turned on and want to put its power onto a live electrical system). In such cases it is important to synchronize the two values before being able to close the associated breaker and "tie" the two electrical sections together. Under the current state of the art—there would be two sets of three phase of potential transformers—one for the line side and one for the load side that would be used by metering and relaying devices to ensure that ONLY on proper proscribed conditions could a breaker be allowed to close.

The bottles of the presently disclosed Omni Sensor™ System described herein, by the mere virtue of their design, provides line and load sensing of Voltage AND Current. The basics of the system provide highly accurate, built in sensing—redundancy—self monitoring, self-calibration (by access to look up tables) and self-maintenance (as the system will "know" when values should be identical from line and load associated load bottle devices). It is to be additionally noted and understood that by duplicating the sensors, both line and load for current and voltage, the overarching electrical systems global security is drastically enhanced. Once each Stationary Primary Disconnect Assembly (aka "Primary Bottle Assembly" or SPDA) becomes a "Smart" PBA (referred to as—S2PBA—Smart Stationary Primary Bottle Assembly or more simply the SPBA) the now digitized data streams become a soup of numbers flowing forth from the pot of six (6) SPBAs. The next step is to synchronize those streams and time stamp each digitized data sample. Effectively turning the soup into coherent salami slices that can be stacked up one at a time and recreate the whole salami log. This is accomplished by the Data Collector/Collector Accumulator (D/C). The D/C will have a number of ports (likely no less than six (6)) to accept the output of each SPBA. Or dual sets of 4 ports each (3 live and out; 3 load and out) for 100% redundancy.

The Data Accumulator will perform the well accepted and documented function of taking multiple "snapshots" during a common high speed clock synch. By "snapping" a shot of the twelve (12) (or more) values (six current and six voltage) from the SPBA's streaming data and having them timed to the micro second—each value of the signals from the line and each load data stream is now completely useable and digitally exportable to be able to reproduce any combination of calculations that previously would need to have been performed on analog values from large, heavy, expensive iron core, copper wound devices.

Measuring current/voltage zero to current/voltage zero provides frequency values to thousandth of a Hz. Measuring current and voltage and frequency provides the downstream metering, relaying, control or communicating device to use the raw data or perform any manner of current, voltage, power, power factor or frequency calculation(s) and/or combination(s) as may be desired.

The D/C will be able to provide an input to itself to take external clock synchs and use them to align its own time tagging numbers to other externally established temporal flows (such examples of external inputs could be a utility computer network used to monitor the System or the various GPS type clock synchs broadcast by government and private entities worldwide)—One would not only know what the fault values were on all six SPBAs at the time the fault occurred—you could also know that it was on a specific day, date and at a specific time.

The SPBA is now effectively replacing the front end of printed circuit boards of every presently made meter or relay AND eliminating the need for the CT's and PT's that feed those front end boards. Once the approach of the present invention is accepted—every relay, control and metering company in the world can be expected to replace their front end integrated circuit boards with an input jack to take in the digital signal(s) of OmniSensor™s of the present invention, rather than the analog signals of dozens to hundreds of pounds of CT's and PT's.

The DC will export the synchronized, digitized values in such a manner and format so as to conform to the major "languages" employed by the "second" (2nd) Boards (the microprocessor boards) of all present metering and relaying devices. Whether they take a Modbus, DNP, 61850 or any manner of data streaming protocol—the D.C. can be programmed and supplied to output its data stream to align with the microprocessor input needs of the most well-known industry standard's driven electronic metering and relaying devices. In other words—the Omni Sensors™ of the present invention can be expected to become universally usable by makers of equipment, just as CT's and PT's have come to be known and employed.

BRIEF DESCRIPTION OF THE DRAWINGS

FIG. 7A is a rear perspective view of the SPDA of the present invention, having a Rogowski coil (shown in dotted lines) embedded around the outside surface of the front of the cylinder and in front of the base and with a capacitive voltage divider also embedded or adjacent to the circular SPDA molding and near to the connector plate for the Mains; while.

DETAILED DESCRIPTION OF THE DRAWINGS, THE PREFERRED EMBODIMENT OF THE INVENTION

As best seen in FIGS. 1-5 and with reference to U.S. Pat. No. 11,444,439 issued Sep. 13, 2022, a switchgear, well known to those of skill in the art, can comprise a large cabinet or housing with a circuit breaker that has an integral roll-in and roll-out electrical chassis to allow insertion and withdrawal of the breaker components from the cabinet or housing. For a greater and immediate understanding of the present invention, the reader is directed to U.S. Pat. No. 11,444,439 issued Sep. 13, 2022, which was obtained by the same Applicant/Assignee as herein. Also, U.S. Pat. No. 12,085,614 issued Sep. 10, 2024, the teachings of that and other expected to be issued US Patents to the same Applicant and/or Assignee are expressly incorporated by reference herein.

A set of Mains (conductors 24) are shown, usually numbering six which are electrically wired in three phase configuration. Each of the three phases has two separate points of power connection for the current flow and defines a line side and a load side. These mains 24 are provided in and through the rear 22 of the cabinet 15 and connect the power supply or line side to the load. These Mains are provided in the rear of the cabinet and connect the power supply to the load, when the electrical mechanism on the movable trolley is pushed fully within the cabinet 15. When that is accomplished, the device is "on line" and will deliver three phase electrical current at the desired/indicated voltage and with significant amperage. Should a fault occur, the power is meant to be cut off and/or ceased by the circuit breaker's automatic operation. This is well known in the art.

Figure 1:
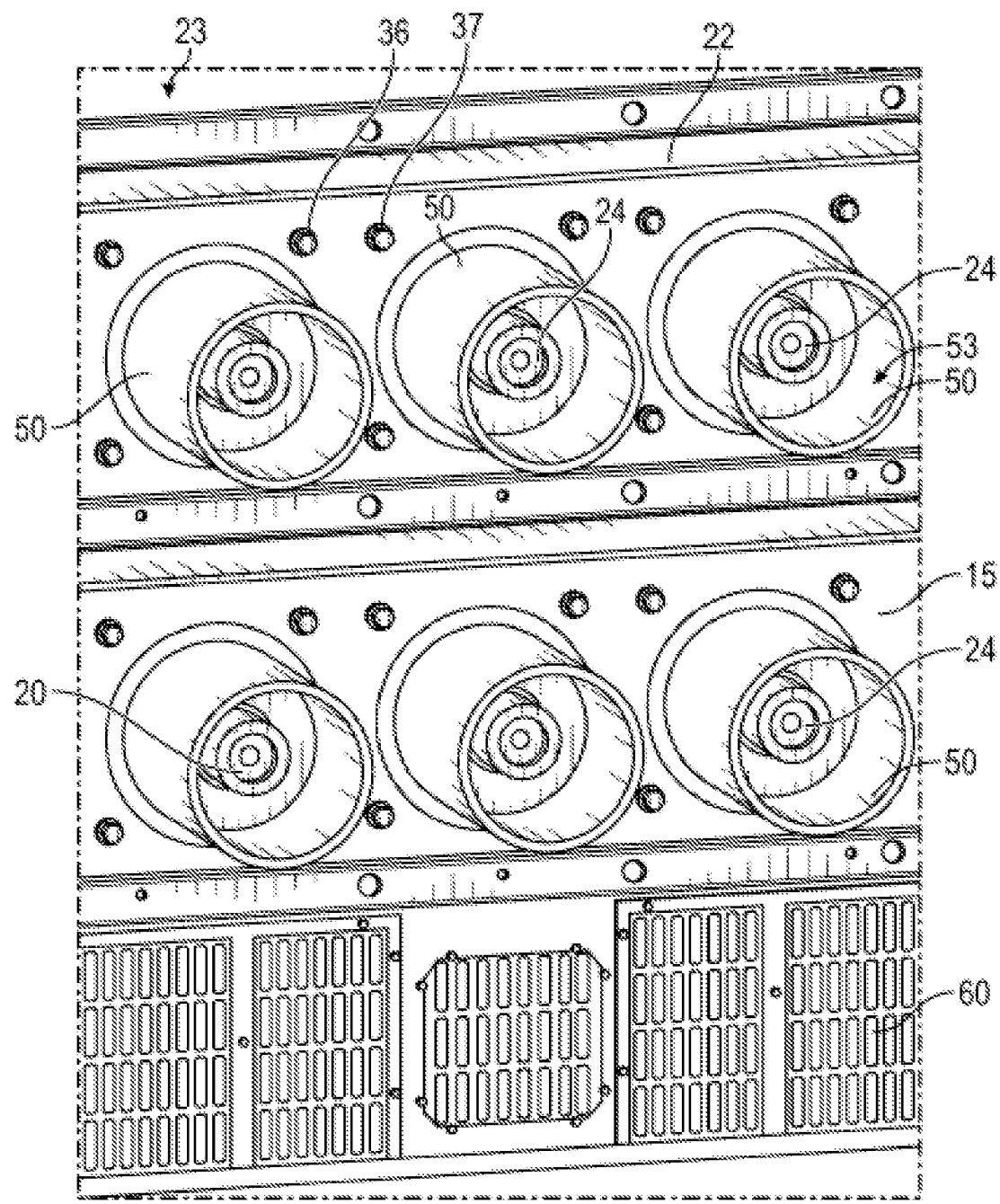
FIG. 1 is an interior view of a rear wall of a medium voltage switchgear, showing the six stacked into two rows, three columns, cylindrical SPDAs or "bottles" which serve as forwardly projecting components for the electrical mating components of the draw-in and draw-out chassis of a typical medium switchgear, with the high voltage conductors passing through the center of the cylindrical SPDAs or bottles towards the rear wall of the cabinetry.
Figure 3:
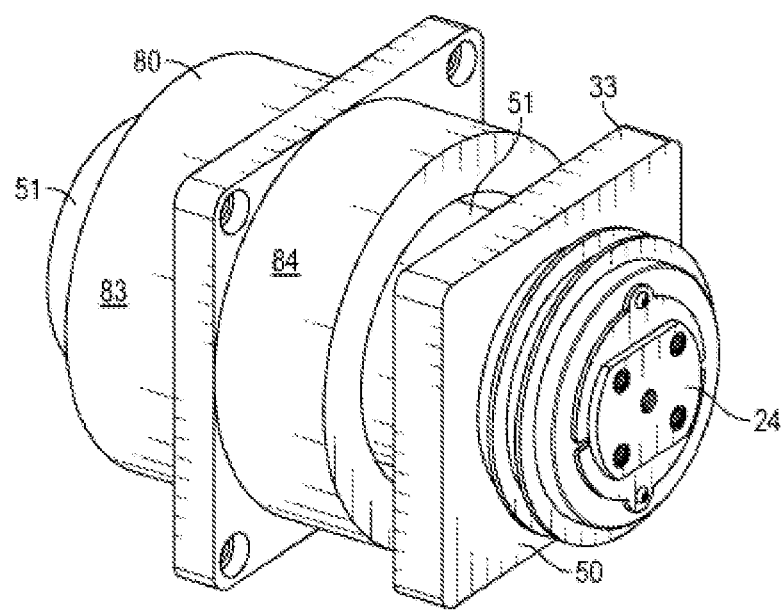
FIG. 3 is a rear perspective view of a single SPDA or bottle (detached from the cabinet of the switchgear) and the prior art current transformer, which slides over the outside cylindrical wall of the SPDA (within the cabinet), the current transformer being the prior art device for providing analog electrical signals for controlling, maintaining or ceasing operation of the circuit breaker aspect of the switchgear.
Figure 4:
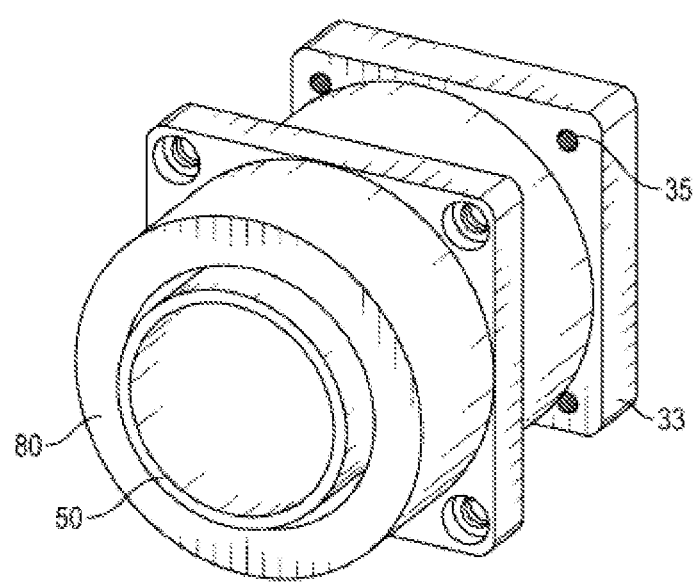
FIG. 4 shows a front perspective view of a single SPDA, unattached to the rear wall of the switchgear's cabinet, and shows the prior art current transformer, which, according to the prior art, is slid over the outside cylindrical wall of the SPDA or bottle within the cabinet, the current transformer being the prior art device for providing analog electrical signals for operation of the circuit breaker function of the switchgear.

When the trolley component is fully rolled into the cabinet and the device "ready for use" the six rearwardly extending and somewhat distal projecting components carrying the Mains 20 of relative high current and voltage will become housed within and be held by the SPDAs 50, the insulating and encircling "bottles," in this representative cabinet 15, six of which project forwardly as cylinders from the rear 22. Stated differently, the corresponding six "bottle" shaped insulators or SPDAs 50 project their cylindrical components 51 forwardly towards the front of the switchgear/cabinet 15. FIG. 1 shows the forwardly projecting bottles or SPDAs 50 with the electrical Mains 20, 24 shown, too, coaxially extending within the center of the bottles or SPDAs 50. FIG. 3 shows bottle component 50 from the rear perspective, surrounded by and yet supporting the prior art bulky, heavy, and expensive heavy core of iron and steel which in the prior art of medium voltage switchgear is secured on the inside of the cabinet and slides over the front end of the bottles or SPDAs 50. The rear wall 22 of the cabinet 15 is shown in FIG. 1 with heat dissipating vents or openings 60 at the base of the rear vertical wall 23 of the cabinet 15.

Figure 2:
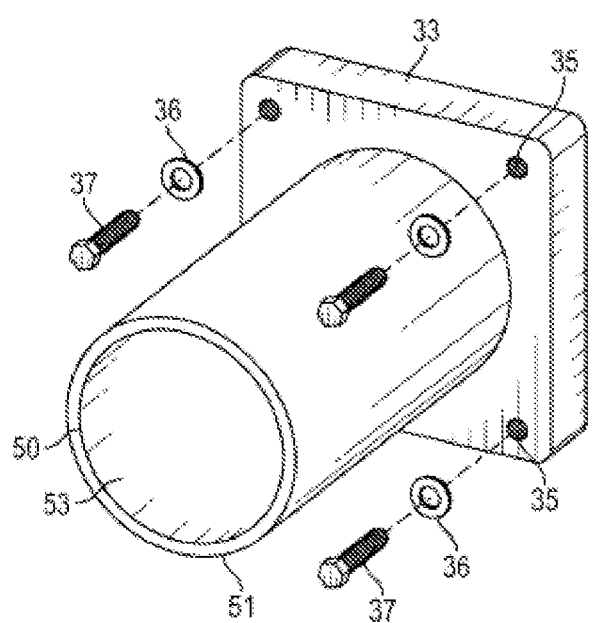
FIG. 2 is a front perspective view of a single SPDA or a bottle, a component of the switchgear which centrally carries within it the electrical conductor and carries, around the SPDA's or bottle's outside cylindrical wall, according to the prior art, the current transformer, shown in FIG. 3.

The SPDAs, rear wall, the Current Transformers of the prior art can be seen and appreciated by understanding and review of FIGS. 1, 2 and 3 of the Drawings. A set of six bottles 10 are shown, in a two vertical stack of three bottles 50 to accommodate the line and load of a three phase electrical switchgear. Each one is expected to house and hold a Mains conductor 24 of electrical power providing current and designated voltage.

Figure 5:
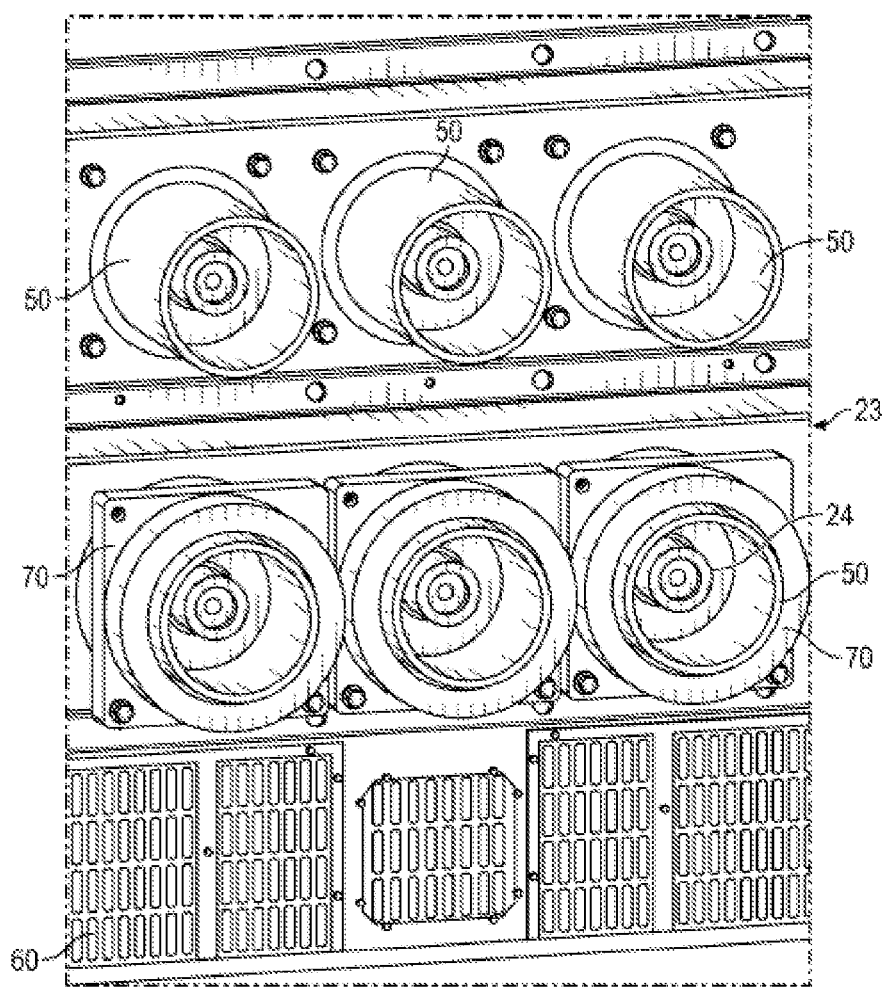
FIG. 5 is a front perspective view of the inside rear vertical cabinet wall of a switchgear according to the prior art and shows on the top, a row of three-high voltage conductors and surrounding cylindrical SPDAs, and in the bottom row, three more cylindrical SPDAs with the prior art current transformers surrounding the bottom row of the SPDAs or bottles, all as will be secured to the inside back wall of the switchgear cabinet according to the prior art.

FIG. 2 shows a SPDA bottle 50, molded of insulative material. The primary "Mains" conductor 20 fits within the inside of the SPDA insulated molding and the SPDA bolts to the rear 22 of the switchgear's cabinet A set of six bottles or SPDAs 50 are shown in FIGS. 1 and 5, in a two vertical stack of three SPDA bottles 50 to accommodate the line and load of a three phase electrical switchgear. Each one is expected to house and hold an electrical power conductor of Mains of electrical power at a voltage and amperage desired. The purpose of the switchgear assembly is to allow voltage and current (i.e. power) to be transmitted (or co-connected) from a source of Power (the line) to the load and as and when desired to stop the same when there is a fault. The switchgear is important so that no further damage to the downstream electrical system occurs if and when a fault occurs. The switchgear simply and mechanically/automatically turns off the circuit by opening the circuit breaker. That is the function of a switchgear, as understood by those of skill in the art.

In the prior art, best understood to understand the present invention, the bottle members or SPDAs 50 project forwardly, from the rear vertical wall 23 of the cabinet 15 of the switchgear towards the front cabinet door of the same. The bottle members each have the main conductor 20, 24 extending coaxially down the middle of the cylinders of the SPDAs, but the bottles or SPDAs are molded and made of insulating material. FIG. 2 shows that the bottle members 50 are provided with an integrally molded rectangular base 33 and a cylinder 51 projects forwardly. The base has recessed PEM-providing threaded holes 35 at the corners of the base 33, with embedded nuts or PEMS within the base. The cylinders pass through openings in the rear wall and, the bolts 37 and washers 36 will be driven through holes in the rear wall and into the PEM holes to secure the base and the SPDAs to the rear of the cabinet with the cylinders projecting forwardly and with the base 33 behind the rear wall. The base, bolts and washers, along with the vertical rear wall of the cabinet hold the bottles or SPDAs 50 and secure the SPDAs to the rear wall 23 of the switchgear housing or cabinet 15, with the cylinder component 51 of the bottle elements or SPDAs 50 formed of insulative material, extending towards the front or cabinet door of the switchgear and the cabinet 15. FIG. 2 shows a traditional SPDA or bottle 50 and the base, bolts, washers, and PEM mechanism for securing SPDAs to the rear wall 23 of the cabinet 15. FIG. 2 shows that the bottle member 50 has holes with embedded nuts at its corners to accept bolts 37 to allow the bottle 50 to be securely held to the rear 22 of the switchgear housing or cabinet 15 with the cylindrical bottle element or SPDA 50, insulative, extending towards the front and door of the switchgear. As shown in FIG. 3, the heavy, bulky and expensive iron windings and steel device 80, a current transformer, used in the past for proportional analog signal current considerations, is slid over the cylinder 51 of the SPDA or bottle 50 and it is bolted (by the same long bolts 37) to the rear wall 23 of the cabinet 15 of the switchgear. FIG. 3 is a rear perspective view of the Mains 20, 24 conductor and the prior art current sensing mechanism (i.e., a current transformer 80) held on and around the cylindrical element portion 51 of the SPDA or bottle 50. Here the central opening 53 (see FIG. 2) of the SPDA or bottle 50 defines the front end 51 of the bottle or SPDA 50.

The current transformer 80 is provided with two cylindrical windings 83 and 84 and a rectangular base 85 with holes 87 at the corners. The bolts 37 will pass through the holes of the base 85, through the rear vertical wall and then pass into and be secured in the PEM holes 35 of the base of the SPDA.

Referring to FIGS. 1, and 3-5, the bottles or SPDAs 50 of the switchgear is(are) shown surrounded by yet supporting the current transformer(s) 80. In accordance with the present invention, that device—the current transformer 80—otherwise slid over and connected to the rear wall 23 of the cabinet 15, at the front of the cylinders 51 of the bottles or SPDAs 50 (and thus indirectly secured to the rear wall 23 at the rear 22 of the cabinet 15) can be eliminated and a lighter weight, less bulky, likely less expensive and highly useful set of electrical devices supplied via directly molding or integrating them into the SPDAs.

Figure 6:
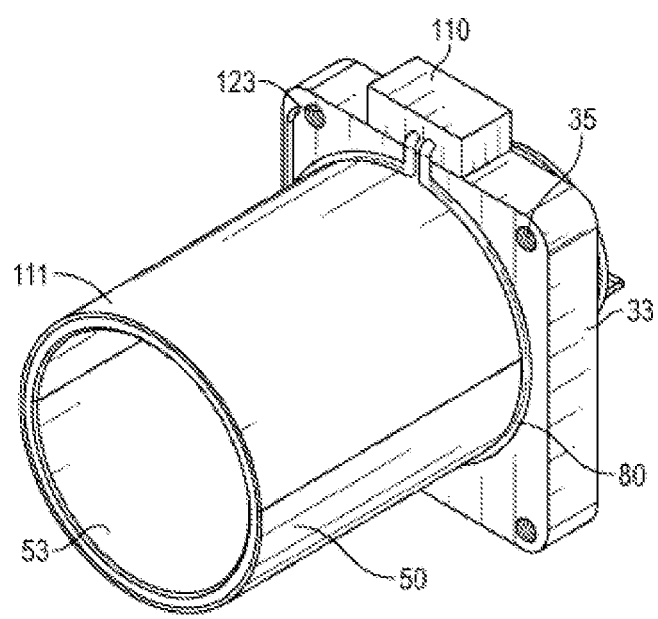
FIG. 6 is a front perspective view of one of the cylindrical bottles or SPDAs of the switchgear, detached from the cabinet's rear vertical wall, but showing it now being provided with an encircling Rogowski coil embedded or molded into the outside molding of the cylindrical, forwardly projecting portion of the bottle.
Figure 7A:
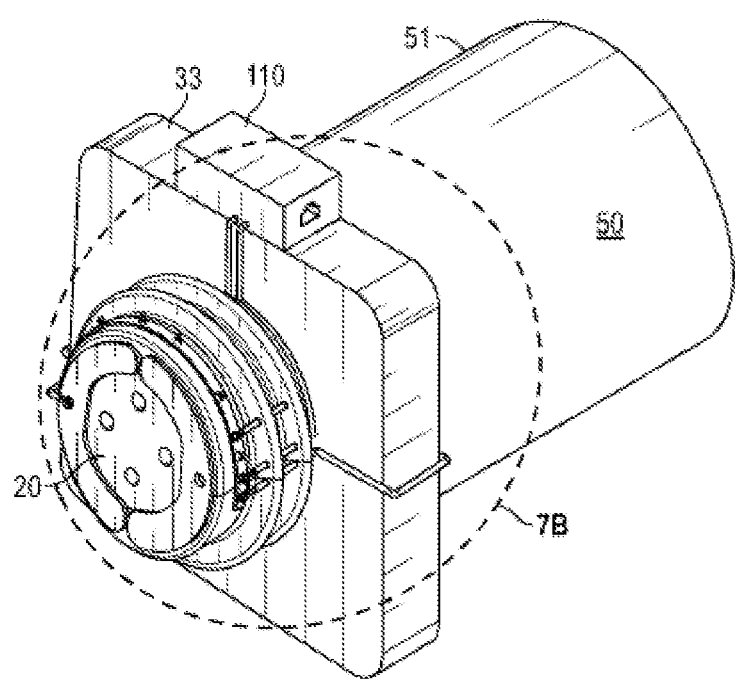
Figure 7B:
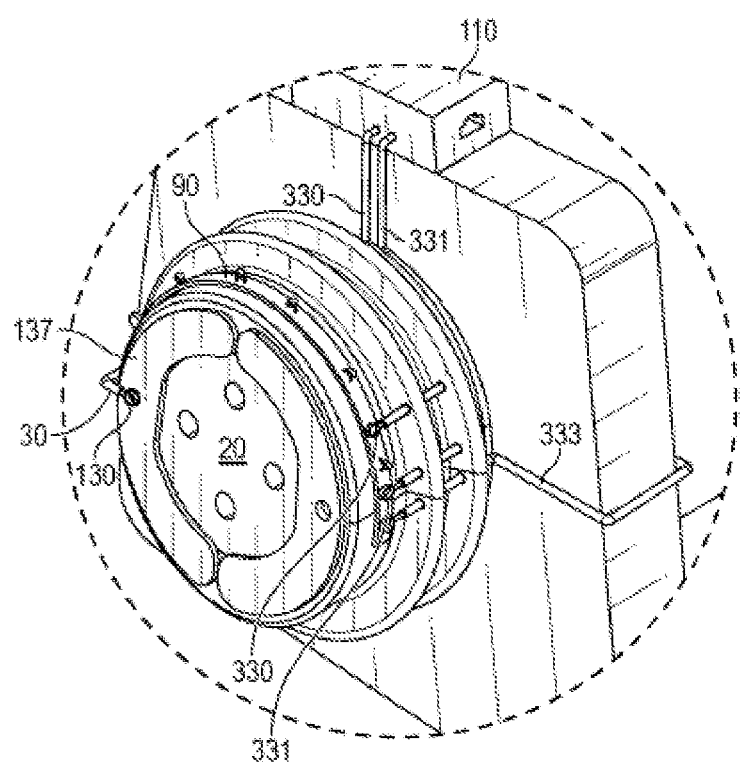
FIG. 7B is a partial and enlarged rear perspective view of the SPDA shown in FIG. 7A, showing the Capacitive or Similar Voltage Divider with one lead connected to the metal plate in direct contact with and surrounding the Mains conductor and another lead shown being schematically connected to ground, by being connected to the chassis of the switchgear.
Figure 8:
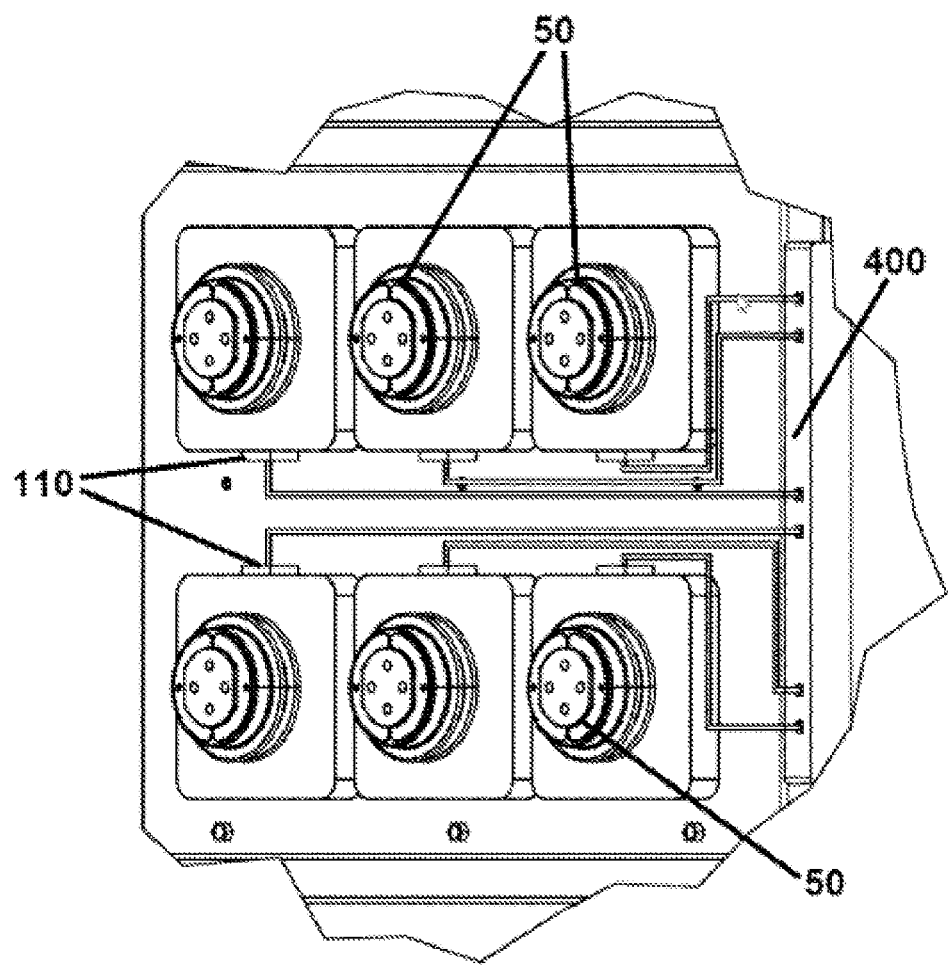
FIG. 8 is a rear perspective and partial view of the Mains and the six SPDAs, without the wiring for the SPDAs to the Integrated Circuits but showing the connection of the Integrated Circuits to the Data Collector for the Switchgear.

According to the invention, as seen in FIGS. 6, 7A and 7B, Rogowski coils 80 and Capacitive (or similar) Voltage Dividers 90 are embedded or otherwise secured around the cylindrical and insulating bottles or components 51 of the bottles or SPDAs 50 and they (with other provided components) provide useful electrical signals, which are adjusted, if needed, by a look up table on the IC, then time stamped, after being converted to digital signals, to downstream component(s). The look up table(s) integrated into the IC are developed at the time of manufacture of the Switchgear by comparing the sensed output to a precisely known set of inputs at the place of manufacture. This will adjust, if necessary, the signals for further use. The details and schematic for the present invention can be seen in FIGS. 6, 7A and 7B.

The Rogowski coils 80 and the Capacitive Voltage Dividers 90 can easily be secured or molded into the insulative epoxy rubber of the bottles, during manufacture of the cylinders 51 of the SPDAs or bottles 50, with the Rogowski coils each having an electrical lead 330, extending therefrom and to the integrated circuit 110. The Rogowski coil can be secured around the cylinder and molded under epoxy. In the preferred embodiment, as seen in FIGS. 6, 7a and 7b, the Rogowski coil surrounds and is embedded into the cylinder of the SPDA and is located at the base 33 of the SPDA, preferably on the inside of the cabinet wall and in front of the cabinet's wall. After location there the Rogowski coil can be covered with epoxy. There is no need for any power lead to the Rogowski coil as it will get power just from the magnetic flux surrounding the Mains conductor. Leads 330, 331 provide the signals from the Rogowski coils 80 and the Capacitive or Similar Voltage Divider 90 to an Integrated Circuit 110 also preferably embedded or molded or otherwise secured to or adjacent/near to the outside circumferential wall(s) 51 of the SPDA/bottle(s) 50.

And, the Capacitive or similar Voltage Divider 90 (See FIGS. 7a and 7b) is molded or also otherwise secured (preferably behind the rear 22 of the cabinet wall 15) to the outside of the cylinders 51 of the bottles 50. Each Capacitive or Similar Voltage Divider 90 is provided with electric leads. One set of leads contacts and is connected between the Mains power conductor which is at system voltage when energized and the other lead is connected to the chassis which is at ground potential. The voltage difference between the Mains conductor and the ground (the chassis is necessarily suitably grounded) is then "divided" by the capacitive or similar voltage divider and a signal of that is also provided to the integrated circuit or IC 110 via lead 331.

The inside wall of the switchgear is schematically illustrated at the cabinet 15, and one lead 333 of the capacitive voltage divider 90, in the current embodiment, is secured, to the chassis as at a terminal of the base of the SPDA and puts one lead of the Capacitive Voltage Divider 90 at ground while another lead 331 is a signal input to the Integrated Circuit 110. The lead for attaching the Capacitive Voltage Divider to the power or Mains 20, 24 is secured to a bolt or terminal 130 securing a partially Surrounding conductive hardware plate 137 that is in contact with the Mains conductor 20. That extends the voltage of the Capacitive Voltage Divider 90 between the system's high voltage (at the conductors' and Mains 20, 24 voltage) and that of zero or ground potential, at the chassis 15, via lead 333.

The Capacitive Voltage Divider 90 has an electrical lead 331 connected to the Integrated Circuit 110 for providing the signal from the Capacitive Voltage Divider thereto. The leads from the Rogowski Coil 330 and the Capacitive Voltage Divider 331 to the Integrated Circuit 110 provide the initial proportional, low power analog indication of the electrical current and voltage for digitizing by the SPDA's integrated circuit 110. The FIGS. show one Ethernet-like connector for connecting the components to the integrated circuit 110 but, it should be appreciated that the other (hidden in the FIGS.) side of the integrated circuit is also provided with a similar electrical signal connection. While the signals provided to the integrated circuit 110 are originally analog, they are immediately converted by the integrated circuit to digital signal values and possibly adjusted by the integrated look up table on the IC. So, for example, if the voltage through the Mains is 4000 volts, and there are 10 identical capacitors, then the analog divided voltage across only one of the capacitors is 400 volts and that would be provided by the capacitive voltage divider 100 to the IC. It would there be converted to digital form and exported via a suitable connection to the Data Collector. Both the now-converted analog to digital streaming signals from the Rogowski coil 80 and the Capacitive Voltage Divider 90 will be time stamped by the Data Collector 400 (not shown) and in turn exported to any desirable industry device for relaying, metering and/or control. The synchronized time stamping of the six SPDA streaming values, allows the Data Collector's 400 exported signal to be inputted and processed as desired for any protective, measured or controlling process. It is understood that the output of the Data Collector 400 is providing a digital replication of all the analog signals that would have come from multiple current and voltage transformers 80 of the Prior Art. Therefore any existing metering, relaying of control schemes used today could easily be replicated and even enhanced by simply modifying its front end inputs to interface with the streaming data of the present invention.

The Integrated Circuit 110 (often referred to as "Ice Cubes") are preferably molded one each to the respective SPDA upon which it sits. Additional insulation for the integrated circuits may be provided. They get their limited but needed control power via an Ethernet connection cable (Cisco of California makes such a device and markets the same as (Power over Ethernet)) that connects to the Data Collector 400. The Data Collector, on the other hand, is basically a six (6) input Ethernet port switch that also has a little bit of "brains" or functionality. Such Ethernet port switches can be purchased, almost as off-the-shelf items, and are available to include a feature called P.O.E. (Power over Ethernet by Cisco). Therefore, the Integrated Circuit 110 molded onto the SPDAs will be fed highly reliable control power by the connector cable which co-joins the SPDA Integrated Circuit 110 and the Data Collector 400. And, then, on the very same cable, the Integrated Circuit 110 will send back out to the Data Collector 400 the integrated circuit's digitized version of the original analog Rogowski coil and CVD or similar devices' signals for that SPDA to which they are secured or molded.

The Data Collector 400 (Ethernet Port Switch) also has a timing signal input (which. can "normalize" the synchronization time stamping of the device as it receives the digitized signals, and an Ethernet Output port. The Data Collector's control power will be obtained by a simple hard wire connection to the Switchgear's DC control power circuitry. This is the very same highly ruggedized control power (from external batteries) that ensures all of the relays and meters mounted on the medium voltage switchgear never go down due to lack of control power. Medium voltage switchgear is designed to not fail when you need it. So the circuit breaker's trip mechanism, along with all the microprocessor devices (relays, meters, controllers) are ALL provided with uninterruptible control power from highly reliable sources such as batteries. That is the standard state of the current art.

According to the present invention, the bottle elements 50 are provided, around their outer circumference 51, with an embedded Rogowski coil 80 and a Capacitive Voltage Divider 90. They provide signals to the associated Integrated Circuit 110 for each bottle or SPDA 50. The Rogowski coil is a low power sensor of the current with the Mains conductor passing through it. Any flow of current (and thus flux) through the Mains will provide an instant, proportional, low power analog signal of the Mains current through the same. That is the nature of such a device as sensed and detected. The SPDA's molded integrated circuit 110 will convert the received analog signal to a streaming digital signal. Also embedded into the outside wall of the bottle elements 50 are six (for example, one per bottle) Capacitive or Similar Voltage Dividers 100. The Capacitive Voltage Dividers 100 have electrical connections between ground and the high voltage of the systems' Mains. One of the connections is meant to be in actual physical contact with the Mains conductor (through the metal hardware plate 137 and holding bolt 130 connecting the plate to the Mains. The other lead is in contact with the switchgear's grounded chassis 15, via lead 333 as schematically shown in FIG. 7B. The electrical connection of the Capacitive Voltage Divider 90 between system voltage and ground, energizes the numerous capacitors of the string. Taking a set of leads across just one of the capacitors provides a proportional, low power, analog divided voltage as its sensed output. This proportional, low power, analog-divided sensed voltage is then also sent to the integrated circuit 110 associated with the SPDA. As can be appreciated, the molded integrated circuit 110 of each SPDA has inputs from its low power analog signals of the current and voltage sensed by that SPDA's Rowgowski coil 80 and Capacitive Voltage Divider 90. These low power analog signals (as passed to the integrated circuit 110) are then digitized and streamed out of each SPDA's integrated circuit 110 and to the Data Collector 400. Alternatively, the Data Collector can do the digitizing. One Data Collector 400 is schematically shown as a mere black box in FIG. 7B and it is anticipated that only a single Data Collector 400 needs to be provided for all of the six (6) SPDA's and their individually integrated circuits 110.

The Data Collector 400 receives the simultaneously streaming digitally converted signals from the integrated circuits 110 of the SPDAs and provides a synchronized time stamp to the six (in this example) received signals from the SPDAs Capacitive or Similar Voltage Dividers. It is this synchronization and retransmission of the data that will create the fully processable signal inputs for all downstream relaying, metering and control devices.

The IC 110 will be provided with internal circuitry architecture to protect its input from the Rogowski coil's direct connection. It is to be remembered that under normal operating conditions, the amperage in the Mains will be from dozens of amps to a few thousands of amps. However under short circuit fault conditions, there might be close to two hundred thousand amps of peak current flowing through the Rogowski coil. That means the Rogowski coil output peak could potentially swing from near zero to a hundred thousand times that amount. Such swings would do great damage (or destroy) the IC input product and terribly distort the same or render otherwise useless output values. By employing an architecture within (and insulation around) the IC that provides for a number of sets of parallel paths for the Rogowski coils' analog signals, the Rogowski signals can be "routed" to one of the several signal paths built to be "tuned" for that value of analog signal. As an illustrative example, consider eggs going down a conveyor belt. Small ones are routed on to one adjacent line—medium, large and jumbo eggs each route out to their own separate lines. Each is then packaged accordingly. Thus, for example, as set forth above, a first path will be provided for very low current loads (small eggs continuing the example), and if the signal of current flow through that Rogowski coil exceeds that first path's sensed and predetermined maximum (medium, large or jumbo eggs), the analog signal will be transferred to the next upper parallel current range. If the maximum of that range is exceeded (corresponding to large or jumbo eggs) the signal will be again passed upwards to the next parallel signal analog to digital converting path and so on, until the maximum of the parallel paths exceeds the possible sensed current. This will protect the Rogowski coils, the IC and provide a meaningful, highly accurate signal in digital form to be outputted and used by the Data Collector.

A Data Collector or Collector Accumulator device 400 is provided. This is downstream of the IC and time stamps (on a nanosecond scale) each of the signals obtained from the SPDA Integrated Circuit 110. The time stamped signals that are now on the output side of the Data Collector 400 are capable of being internally compared to each other within the Data Collector as well as immediately outputted in streaming fashion to become the input signal for the relaying, metering and control devices selected to "watch over" this particular electric circuit device. In this manner, a set of meaningful data points are created, capable of inter-comparison to one another and to a well-established standard of what is expected and intended to be flowing through the switchgear. If a discrepant set of signals is "seen" by the Data Collector, (or the attached downstream devices) the switchgear will act accordingly. The Data Collector can compare adjacent (in time) and adjacent (in the set of Mains) signals to self-monitor the proper functioning of the device. While all is operating well—these signals will provide the metering, monitoring and control data used to measure, record and display the real time conditions.

The Data Collector can (will) be electrically (digitally communicationally) connected to a controller(s) 200 (not shown) which can sense the analyzed signals and provide the system operator(s) with meaningful results for analysis and review.

As should be appreciated by one of ordinary skill in the art, the present invention is a highly improved replacement for the bulky, heavy, expensive Current and Voltage Transformers used throughout the circuit breaker and electrical industry for protection, control, & monitoring. Thus, it is expected that upon adoption of this new standard of replacement of the current transformers, there will be many other usages of the one or more Rogowski coils along with one or more capacitive voltage dividers, connected to an integrated circuit for converting analog signals to digital, with or without time stamping, and thus providing a digital representation of the current and voltage of electrical devices and then using that information and/or transmitting to a data collector, in a wide variety of applications, all to great advantage.

These electrical components, circuitry and process specifically remove the need that is currently employed to re-amplify the Rogowski coil and CVD signals to make them mimic CT and PT secondary output signals. Instead of taking the low power signals of the Rogowski coil and CVD—the present invention digitizes them. The invention keeps the low power signal of the Rogowski coil and CVD, handles the wide range of possible signal processing issues and maintains the entire digital nature of the scheme's architecture. Time Stamped Synchronization of the SPDA signals makes the streamed digitized signal an enhanced replacement for the presently employed CT/PT analog architecture.

As should be appreciated by one of ordinary skill in the art, the present invention is a replacement for the bulky, heavy, expensive Current Transformers used throughout the electrical control, monitor, and circuit breaker industry. Thus, it is expected that upon adoption of this new standard of replacement of the current transformers, there will be many other usages of the Rogowski coil, with a capacitive voltage divider, connected to an integrated circuit for providing a digital representation of the current and voltage and then to a data collector, with or without time stamping for aiding analysis, in a wide variety of applications, all to great advantage.

The term—"look up table" is understood by those of ordinary skill in the art. However, the function of the same is that, "on board" in the electronics of integrated circuitry, it is a mechanism available for calibration as it is a calibration chart built into and stored on the electronics. A look up table is a mechanism of factory calibration of the switchgear. It is made at the end of the switchgear production stage. One first builds a test set up that can and will Reliably produce very accurate levels of voltage and current. The manufactured Omni sensor is then connected The Omni sensor is then connected to the very accurate test set up. The manufacturer provides from the test set up mechanism an amp, 10 amps, 100 amps, 1000 amps and even, for example, 10,000 amps. This is known as the standard and the test set up must be capable of reliably and accurately producing that which is then desired. Same for voltage, say, for example, 20%, 50%, 80% and 1005, even 120% of nominal value for the sensor and switchgear. Whatever the Omni sensor indicates or reports as its output either exactly the same as the test set input (which will rarely happen) or (more likely) the output shows that it is "off" by some amount from the test set's very accurate and known output value is then tweeked to the manufactured product by providing a look up table on the IC to adjust the output of that device to that the output values of the test set and the manufactured component line up perfectly. So, for example, if the output of the manufactured device shows 10.2 amps, and the known value should be 10 amps, the look up table will be consulted automatically and adjust a reading of 10.2 to a reading of 10. Two or more such readings should be taken and since they are straight line proportional devices (the Rogowski coil and the Capacitive or Similar Voltage-like dividers) one can provide a simple look up table or "program" in the IC which provides for substantially all values between the test values and provide the known equivalent straight line outputs. The accuracy will be far better than any existing CT or PT by an order of magnitude.

In other words—the digital output values the customer sees as being spit out by the Omni sensor are not the ACTUAL OUTPUTS of the Rogowski or Capacitive or Voltage-like divider but rather the massaged, or translated & tweaked values of the lookup table on the IC.

For example, if the testing calibration figures out that if one inputs exactly 100 amps—the Rogowski coil may originally reflect it to be 101.5 amps—so the lookup table knows the value needs to be fine tuned downwardly and indicate to the customer and others that the adjusted current is 100 amps—not 101.5. If you do this calibration at a hand full of inputted current and voltage points, and use the Look Up table for adjustment, that locks down the Omni sensors inherent error, i.e., the lookup table corrects those points. And then since everything between each set of two test points has the same (more or less) error—the Look Up table of the IC "corrects" for all the intermediate points by employing the same amount of "tweak" or correction throughout all the possible readings between each set of test points.

I claim:

1. An integrated and compact mechanism for protecting, monitoring and/or controlling a switchgear comprising at least a voltage and current flow provider device having a surrounding, insulating cylindrical bottle containing a Mains conductor passing therethrough comprising:

a Rogowski coil closely surrounding and molded into said insulating cylindrical bottle for sensing and providing an analog signal of current passing through said Mains conductor;

a capacitive or similar voltage divider-like device sensing and providing a proportional analog signal of the voltage of said Mains conductor and also closely surrounding and molded into said insulating cylindrical bottle, having a first direct electrical lead connected to said Mains conductor and a second direct electrical lead to ground;

a shielded and integrated circuit board electrically connected to the analog outputs of the signals of both said Rogowski coil and said capacitive voltage divider-like device, capable of converting said analog signals to digital signals of the same, said integrated circuit board further comprising a stored look up table having calibrated indicia of digital signals based on a predetermined accurate set of values obtained from a known and verified standard, and said integrated circuit board further comprising a memory device, wherein said current and/or voltage digitally converted and calibrated signals from said look up tables are stored in said memory, as desired for further comparison and/or end use; and a data collector for at least some of said analog and/or said digital and/or said calibrated signals, optionally further comprising a means for time stamping said inputted set of said analog and/or digital and/or calibrated signal sets for comparing the same, over time or not; and said data collector being connected to electro- and/or mechanical means for modifying, controlling and/or disturbing the flow of current and/or voltage if certain predetermined conditions are met by said compared sets of signals or to a predetermined set of standard values of such signals.

2. A mechanism as claimed in claim 1 wherein said integrated circuit board is located within said switchgear and adjacent to the outer and insulative circumferential wall of said bottle.

3. A mechanism as claimed in claim 2 wherein said capacitive or similar voltage divider-like device is superimposed over or embedded immediately beneath said Rogowski coil.

4. A mechanism as claimed in claim 1 wherein 6 insulating cylindrical bottles are provided to said switchgear, each encircling a Mains conductor with current flow and voltage provided therethrough and each of said bottles being provided with said integrated and compact mechanism comprising said Rogowski coil and Capacitive or similar Voltage Divider-like devices and wherein said each of said integrated circuit boards direct their converted and calibrated look-up table digital signal outputs for analysis to a single data collector before or after providing the same to said memory device.

5. A method of protecting, monitoring or controlling an electrical switchgear having one or more insulative bottles surrounding one or more Mains conductor power lines passing through each of said cylindrical insulative bottles, comprising the steps of:

providing a Rogowski coil substantially immediately surrounding each of said cylindrical insulative bottle(s) which senses and transmits an analog signal corresponding to current flow through said Mains conductor;

providing a capacitive or similar voltage divider-like device proximal to said insulative bottle(s) which senses and transmits an analog signal of the voltage passing through said Mains conductor, said capacitive or similar voltage divider-like device being in direct electrical contact with said Mains conductor passing through said cylindrical insulative bottle to which it is provided and to ground;

providing and connecting an integrated and shielded circuit board proximal to each of said Rogowski coil(s) and/or said capacitive or similar voltage divider-like device(s) for receiving and converting said analog current and voltage signals to digital signals; and using a look-up table stored on said integrated and shielded circuit board for said digital signals to provide a calibrated indicia of said digital signal based on a predetermined set of values contained on said look up table, and then storing the calibrated indicia on a memory device for retrieval therefrom, as desired for further end use;

and/or passing said calibrated digital signals to a data collector for optionally time stamping the same and for comparing at least one of said digital signal sets to a separately timed set of either or both of said voltage and/or said current passing through said Mains conductor passing through said bottle-like devices or to a standard for providing an electrical or electro-mechanical or mechanical action for protecting, monitoring or controlling an electrical switchgear.

6. A method as claimed in claim 5 wherein six bottles are provided for producing two sets of three phase electrical Mains conductors or pathways for said switchgear.

7. A method as claimed in claim 5 wherein time stamped digital signal sets of said Rogowski coil(s) and said capacitive or similar voltage divider(s) like devices of values of the current and/or voltage, respectively, passing through said Mains conductor(s) are used to monitor the switchgear and the protecting, monitoring and/or controlling of said switchgear if said digital signals, as calibrated by said look up tables on said integrated circuit, exceed or differ from a predetermined standard for said Mains conductors.

8. A method as claimed in claim 5 wherein multiple and separate parallel signal analyzing paths are provided within said integrated and shielded circuit board for converting said analog signals to digital signals with each but the last of such paths having a maximum which, if exceeded by either said current or said voltage analog signals, will pass the signal to the next upper maximum parallel path and adjacent range for conversion to a digital signal, with the next upper maximum and adjacent range having a greater maximum than the prior parallel path.

9. An integrated circuit board device for use in protecting, monitoring and/or controlling electrical devices in the field having a voltage and current flow provider via a Mains conductor comprising:

a Rogowski coil surrounding said voltage and current flow provider, said Rogowski coil providing an analog signal of current flow through said Mains conductor;

a capacitive or similar voltage divider-like mechanism in close proximity to said voltage and current provider in said Mains conductor, having one lead in contact with said voltage and current flow provider and another lead connected to ground, said capacitive or similar voltage divider like mechanism providing an analog signal of voltage;

analog to digital conversion means for converting said analog signals from both said Rogowski coil and said capacitive or similar voltage divider like mechanism to digital signals;

an integrated circuit board electrically connected to the inputs of said analog to digital conversion means of both said Rogowski coil and said capacitive or similar voltage divider-like mechanism, said integrated circuit board being capable of analog to digital signal conversion and also having a look up table stored thereon for calibrating the resulting digital signals to a precisely calibrated set of the same based on previously obtained bench testing of a precisely known standard Mains conductor of voltage and current flow in comparison to said field-based voltage and current flow provider;

and a means for electrically, mechanically, or electro-mechanically changing the state of said electrical device when said digital signals from said Rogowski coil and/or said capacitive or similar voltage divider-like mechanism change over time.

10. An integrated circuit board device for use in protecting, monitoring and/or controlling electrical devices having a voltage and current flow provider therein as set forth in claim 9 further comprising a time stamping mechanism and a memory for retaining at least two time separated sets of said digital signals received from said Rogowski coil and said capacitive or voltage divider-like device.

11. An integrated circuit board device for use in protecting, monitoring and/or controlling electrical devices having a voltage and current flow provider as claimed in claim 9 further comprising a memory means and a data collector mechanism for storing and allowing retrieval and analysis of digital signals from said memory.

12. An integrated circuit board device for use in protecting, monitoring and/or controlling electrical devices having a voltage and current flow provider as claimed in claim 9 further comprising a memory means and a data collector mechanism for storing and allowing retrieval and analysis of digital signals from said memory of said digital signals.

13. An integrated circuit board device for use in protecting, monitoring and/or controlling electrical devices having a voltage and current flow provider as claimed in claim 9 wherein said integrated circuit board device is embedded into the outside insulating circumferential wall of a bottle in a switchgear.

14. An integrated circuit board device as claimed in claim 13 further comprising shielding for isolating said integrated circuit board device from stray signals from said voltage and current flow provider.

* * * * *